(12) United States Patent
Sato

(10) Patent No.: US 9,288,895 B2
(45) Date of Patent: Mar. 15, 2016

(54) ELECTRICAL DEVICE

(71) Applicant: Seiko Epson Corporation, Tokyo (JP)

(72) Inventor: Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 218 days.

(21) Appl. No.: 14/230,198

(22) Filed: Mar. 31, 2014

(65) Prior Publication Data
US 2014/0211428 A1 Jul. 31, 2014

Related U.S. Application Data

(63) Continuation of application No. 13/402,055, filed on Feb. 22, 2012, now Pat. No. 8,848,388.

(30) Foreign Application Priority Data

Mar. 2, 2011 (JP) ................................ 2011-045479

(51) Int. Cl.
*G02F 1/167* (2006.01)
*H05K 1/02* (2006.01)
*G02F 1/1345* (2006.01)
(Continued)

(52) U.S. Cl.
CPC .............. *H05K 1/028* (2013.01); *G02F 1/1345* (2013.01); *G02F 1/133305* (2013.01); *G02F 1/167* (2013.01); *G09G 3/344* (2013.01); *G09G 2300/0426* (2013.01); *G09G 2330/04* (2013.01)

(58) Field of Classification Search
None
See application file for complete search history.

(56) References Cited

U.S. PATENT DOCUMENTS

| 5,953,086 A * | 9/1999 | Oogiichi ........... G02F 1/136204 |
| | | 349/139 |
| 6,914,643 B1 * | 7/2005 | Nagase ............. G02F 1/136204 |
| | | 349/40 |
| 7,408,697 B2 | 8/2008 | Kawai |

(Continued)

FOREIGN PATENT DOCUMENTS

| JP | 2000-330131 A | 11/2000 |
| JP | 2001-281687 A | 10/2001 |

(Continued)

OTHER PUBLICATIONS

Non-Final Office Action received in U.S. Appl. No. 13/402,055; Dec. 16, 2013.

(Continued)

*Primary Examiner* — Hoa C Nguyen
*Assistant Examiner* — Xanthia C Cunningham
(74) *Attorney, Agent, or Firm* — ALG Intellectual Property, LLC

(57) ABSTRACT

In one embodiment, an electrical device includes a first substrate with a first side and a second side, a second substrate opposed to the first side of the first substrate, and a functional element arranged between the first side of the first substrate and the second substrate. The electrical device includes a first electrode arranged to a first substrate side of the functional element and overlaps with the functional element in planar view, and a second electrode arranged to a second substrate side of the functional element and overlaps with the functional element in planar view. The electrical device includes an electronic component arranged between the functional element and the first electrode, overlapping the first electrode and the second electrode in planar view, and driving the functional element. The electrical device includes a connecting section electrically connecting the first electrode to the second electrode.

16 Claims, 20 Drawing Sheets

(51) Int. Cl.
*G02F 1/1333* (2006.01)
*G09G 3/34* (2006.01)

(56) References Cited

U.S. PATENT DOCUMENTS

| | | | | |
|---|---|---|---|---|
| 7,436,480 | B2* | 10/2008 | Kang | G02F 1/13394 349/139 |
| 7,495,737 | B2* | 2/2009 | Kim | G02F 1/1345 349/149 |
| 7,551,345 | B2 | 6/2009 | Uchida | |
| 7,593,234 | B2 | 9/2009 | Okuda | |
| 7,602,451 | B2 | 10/2009 | Hinata | |
| 7,602,456 | B2* | 10/2009 | Tanaka | G02F 1/13458 349/42 |
| 8,014,060 | B2* | 9/2011 | Hong | G02F 1/167 257/294 |
| 8,218,098 | B2* | 7/2012 | Lee | G02F 1/13452 349/40 |
| 8,228,474 | B2* | 7/2012 | Imakawa | G02F 1/13394 349/139 |
| 8,248,570 | B2* | 8/2012 | Chen | G02F 1/13394 349/155 |
| 8,253,699 | B2* | 8/2012 | Son | G06F 3/047 178/18.01 |
| 8,310,009 | B2* | 11/2012 | Saran | B82Y 20/00 257/13 |
| 8,334,959 | B2* | 12/2012 | Hirabayashi | G02F 1/136204 345/104 |
| 8,436,968 | B2* | 5/2013 | Lin | G02F 1/133512 349/116 |
| 8,611,000 | B2* | 12/2013 | Komatsu | G02F 1/167 359/296 |
| 8,698,000 | B2* | 4/2014 | Moriwaki | G02F 1/1345 174/250 |
| 8,928,968 | B2* | 1/2015 | Lo | G02F 1/167 359/296 |
| 8,988,762 | B2* | 3/2015 | Shin | G02F 1/167 349/33 |
| 2003/0049885 | A1* | 3/2003 | Iijima | H01L 21/4857 438/106 |
| 2003/0071931 | A1 | 4/2003 | Nakayoshi et al. | |
| 2004/0105064 | A1 | 6/2004 | Hagiwara | |
| 2004/0119776 | A1 | 6/2004 | Nakamura | |
| 2004/0183986 | A1 | 9/2004 | Onda et al. | |
| 2005/0162597 | A1 | 7/2005 | Wachi | |
| 2005/0285843 | A1 | 12/2005 | Yoshinaga et al. | |
| 2006/0024957 | A1* | 2/2006 | Harada | G02F 1/1345 438/637 |
| 2006/0055864 | A1 | 3/2006 | Matsumura et al. | |
| 2006/0215068 | A1* | 9/2006 | Nakagawa | G02F 1/136213 349/38 |
| 2007/0146309 | A1 | 6/2007 | Uchida | |
| 2007/0173031 | A1 | 7/2007 | Kodaira et al. | |
| 2007/0177248 | A1 | 8/2007 | Kanbayashi | |
| 2007/0235777 | A1 | 10/2007 | Nagata | |
| 2008/0068785 | A1 | 3/2008 | Noguchi et al. | |
| 2008/0088758 | A1* | 4/2008 | Shie | G02F 1/1341 349/40 |
| 2008/0117497 | A1 | 5/2008 | Shimodaira | |
| 2008/0165316 | A1 | 7/2008 | Hasegawa et al. | |
| 2008/0171484 | A1 | 7/2008 | Yamashita et al. | |
| 2008/0266514 | A1* | 10/2008 | Moriya | G02F 1/136204 349/187 |
| 2008/0277664 | A1* | 11/2008 | Kim | G02F 1/167 257/59 |
| 2008/0314626 | A1 | 12/2008 | Moore | |
| 2009/0026171 | A1 | 1/2009 | Ito | |
| 2009/0045463 | A1* | 2/2009 | Chang | H01L 27/0248 257/355 |
| 2009/0137095 | A1 | 5/2009 | Shimomura et al. | |
| 2009/0153765 | A1* | 6/2009 | Yamashita | H01L 24/17 349/58 |
| 2009/0174928 | A1* | 7/2009 | Kim | G02F 1/13454 359/296 |
| 2009/0185260 | A1 | 7/2009 | Uchida | |
| 2009/0310314 | A1* | 12/2009 | Shinn | G02F 1/167 361/749 |
| 2010/0039354 | A1 | 2/2010 | Sakamoto | |
| 2010/0066969 | A1* | 3/2010 | Hwang | G02F 1/133305 349/158 |
| 2010/0067211 | A1* | 3/2010 | Han | G02F 1/167 361/818 |
| 2010/0085718 | A1 | 4/2010 | Sakurai et al. | |
| 2010/0156779 | A1* | 6/2010 | Park | G02F 1/167 345/107 |
| 2010/0302614 | A1* | 12/2010 | Peng | G02B 26/001 359/230 |
| 2011/0159618 | A1* | 6/2011 | Shinn | H01L 21/02554 438/30 |
| 2011/0194229 | A1 | 8/2011 | Choi et al. | |
| 2012/0038861 | A1* | 2/2012 | van Lieshout | G02B 5/201 349/106 |
| 2012/0326956 | A1* | 12/2012 | Ueki | G09F 9/372 345/107 |

FOREIGN PATENT DOCUMENTS

| | | |
|---|---|---|
| JP | 2002-182238 A | 6/2002 |
| JP | 2003-195352 A | 7/2003 |
| JP | 2004-184978 A | 7/2004 |
| JP | 2004-279742 A | 10/2004 |
| JP | 2005-292579 A | 10/2005 |
| JP | 2007-249231 A | 9/2007 |
| JP | 2007-271957 A | 10/2007 |
| JP | 2007-281155 A | 10/2007 |
| JP | 2008-058468 A | 3/2008 |
| JP | 4189887 B | 12/2008 |
| JP | 4366743 B | 11/2009 |
| JP | 2010-044337 A | 2/2010 |
| JP | 2010-506400 A | 2/2010 |
| WO | WO-96-41327 A | 12/1996 |
| WO | WO-03-044765 A | 5/2003 |
| WO | WO-2008-042110 A | 4/2008 |

OTHER PUBLICATIONS

Notice of Allowance and Notice of Allowability received in U.S. Appl. No. 13/402,055; May 27, 2014.

* cited by examiner

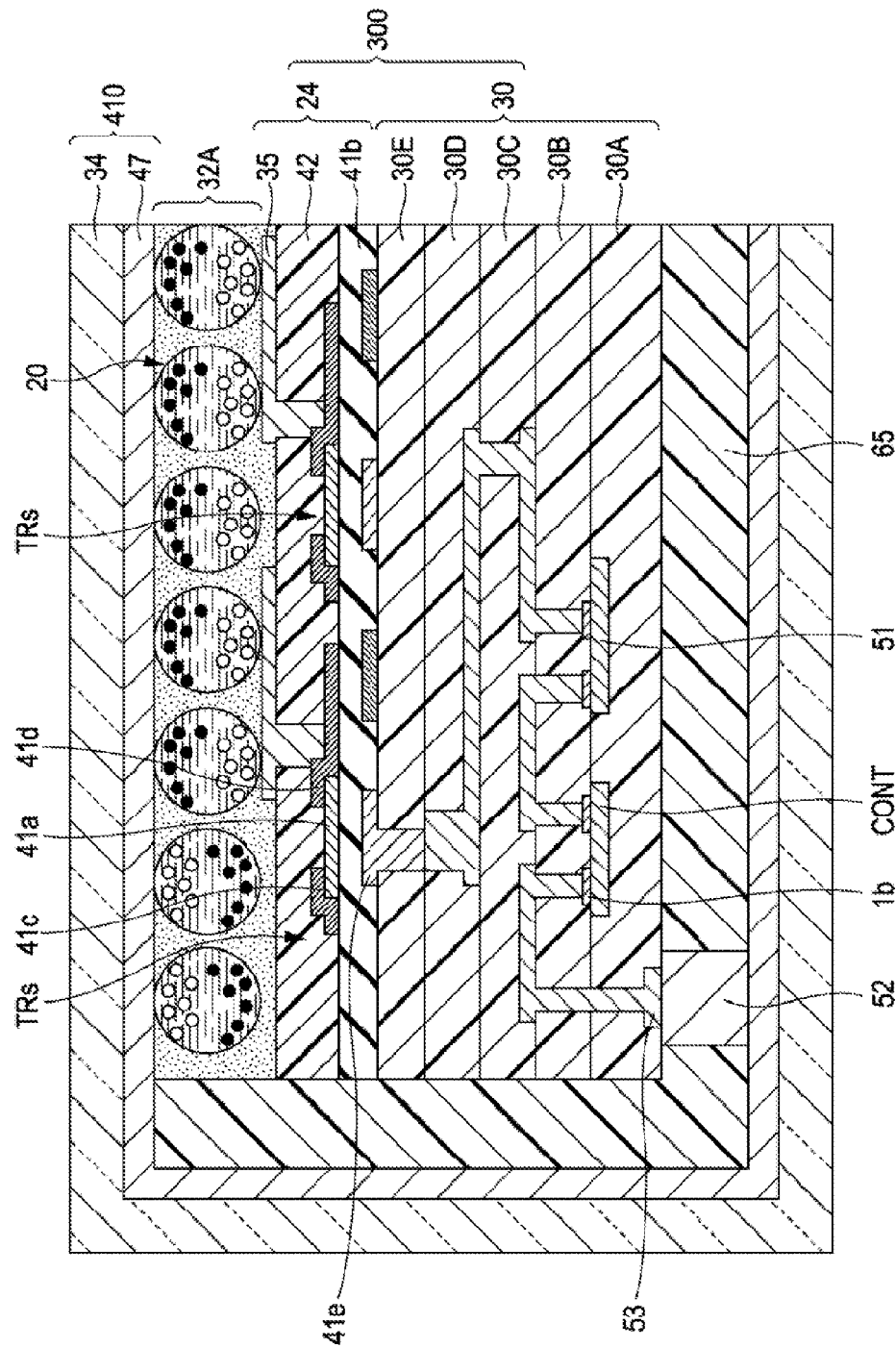

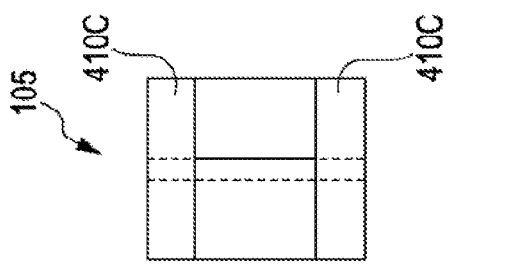
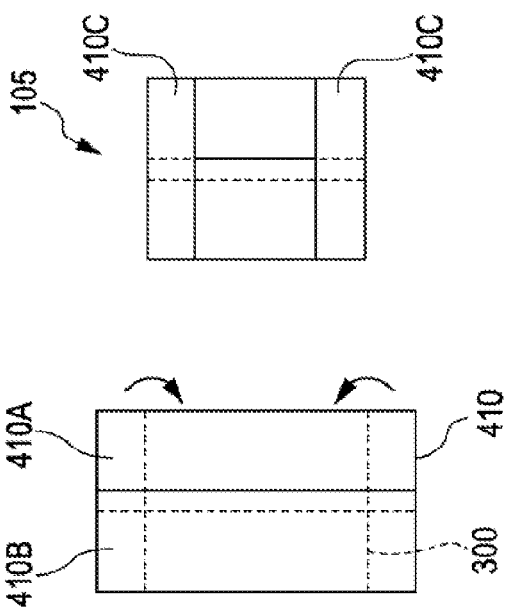
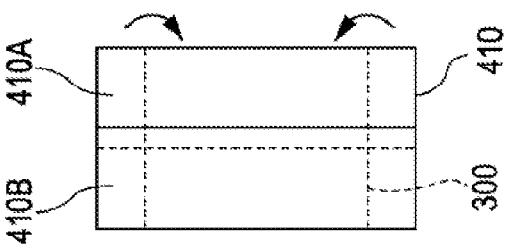
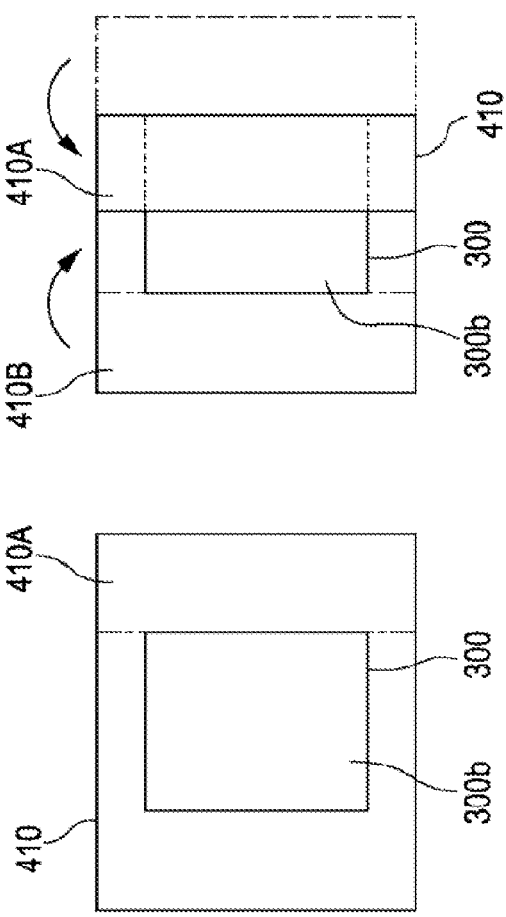

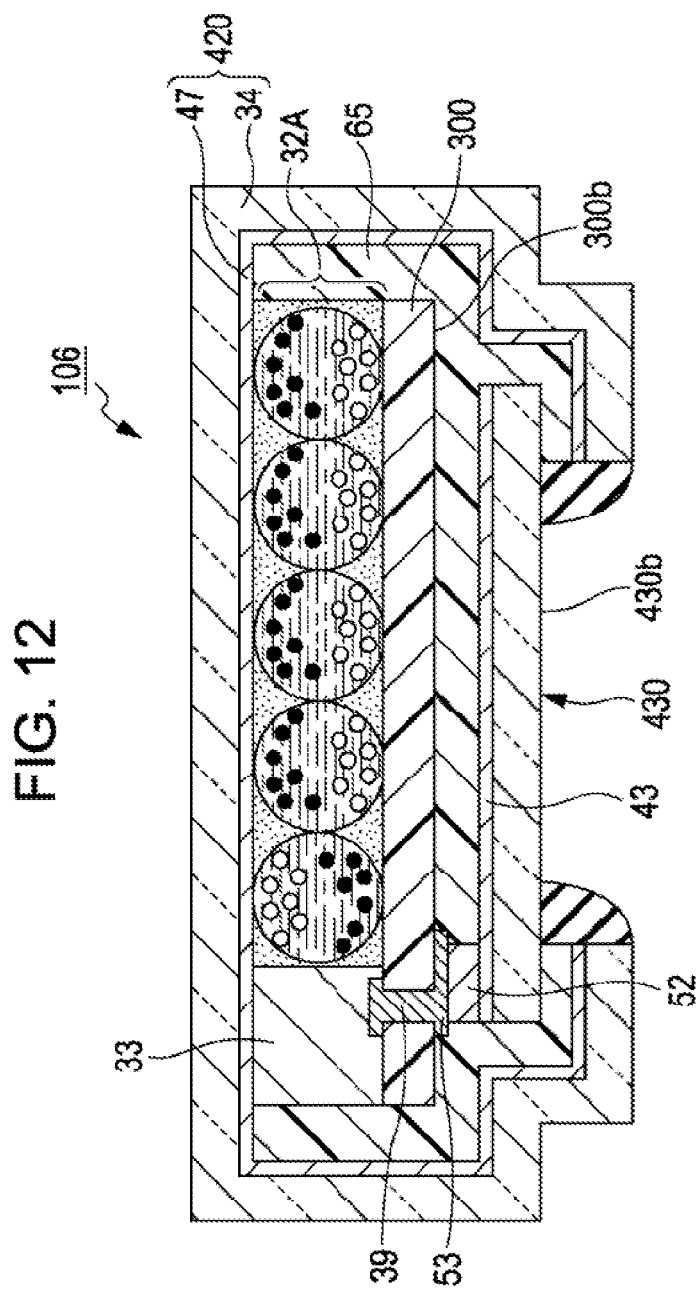

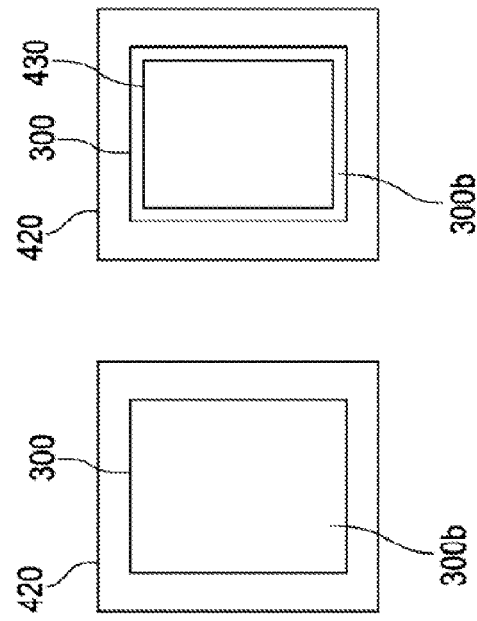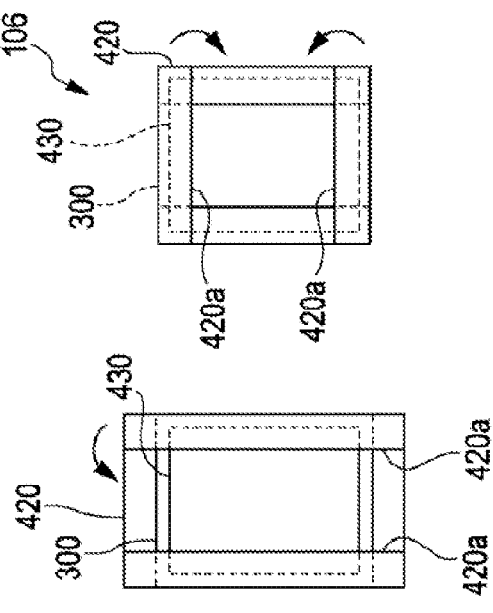
FIG. 13A  FIG. 13B  FIG. 13C  FIG. 13D  FIG. 13E

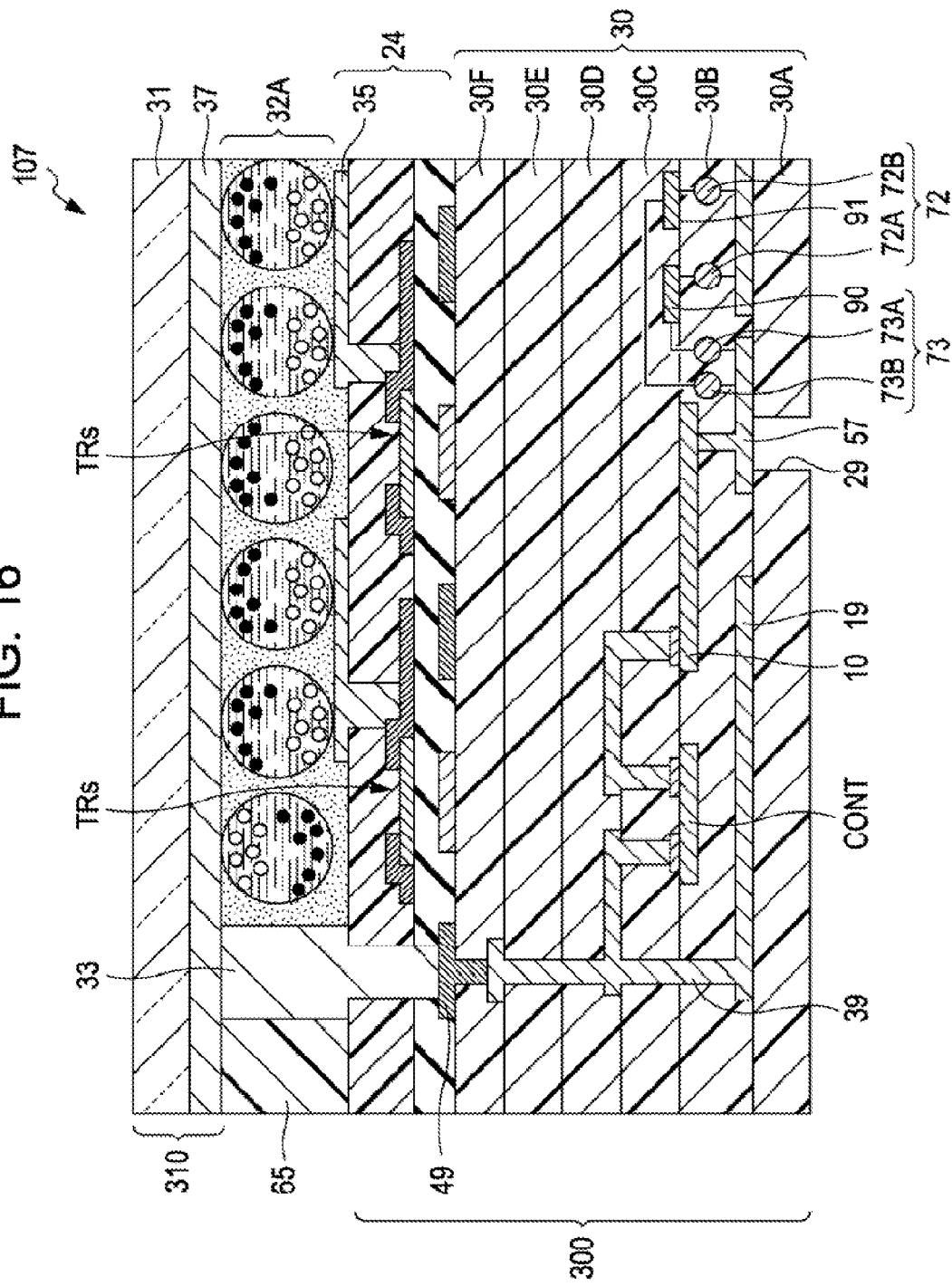

ELECTRICAL DEVICE

CROSS-REFERENCE

The present application is a continuation application of U.S. patent application Ser. No. 13/402,055 filed on Feb. 22, 2012, which claims priority from Japanese Patent Application No. 2011-045479 filed on Mar. 2, 2011, which are hereby expressly incorporated by reference in their entirety.

BACKGROUND

1. Technical Field

The present invention relates to an electrical device.

2. Related Art

In recent years, a typical configuration of a flat panel display (electrical device) such as a liquid crystal device, an organic EL display device, or an electrophoretic display device is disclosed in JP-A-2007-249231 and Japanese Patent No. 4366743, a TFT active matrix is formed on an element substrate which is formed from a rigid glass substrate and a connection substrate (FPC) with flexibility which is mounted with a driving circuit is connected on at least one side of the element substrate.

However, in the case of the configuration described above, since the connection substrate with flexibility is used by being bent to the rear surface side of the display device, the side which is connected to the connection substrate is not able to be bent even if, for example, a display section is configured by a base material with flexibility. As a result, it is not possible to have flexibility at all four sides.

SUMMARY

An advantage of some aspects of the invention is that a thin and light electrical device with flexibility is provided.

The present inventors have already proposed a configuration which is able to have flexibility similar to paper through electronic components or the like which configure a driving circuit being embedded between a plurality of base materials with flexibility. However, display defects occur such as, for example, a certain region not returning after becoming black when a display device such as this is placed on a desk and lifted up from there or the rear surface side of the display device is touched. This has been revealed to be due to a transistor being broken due to static electricity or an abnormally high voltage being applied to the electrophoretic material. The invention suppresses the occurrence of defects due to static electricity such as this.

According to an aspect of the invention, an electrical device is provided with a first substrate and a second substrate which are disposed in an opposing manner so as to interpose a functional element, a first electrode (rear surface electrode) which is provided more to the first substrate side than the functional element, a second electrode (opposing electrode) which is provided on the second substrate and is electrically connected to the first electrode, and the functional element and an electronic component which drives the functional element in a region which is a region where the first substrate and the second substrate overlap and which is interposed between the first electrode and the second electrode.

According to this, since the first electrode provided on the first substrate and the second electrode provided on the second substrate are electrically connected to each other, even if a high potential is applied to the first electrode or the second electrode, it is difficult for the functional element or the electronic component which are disposed therebetween to be damaged. As such, it is possible to suppress the effect of static electricity with regard to the functional element and the electronic component which is disposed between the first electrode and the second electrode.

In addition, there may be a configuration where the second electrode is a common electrode of the functional element.

According to this, even if a high potential is applied to the common electrode of the functional element (the second electrode) and the first electrode, it is difficult for the functional element or the electronic component which are disposed therebetween to be damaged.

In addition, there may be a configuration where the first substrate is a laminate of a plurality of base materials and the first electrode or the electronic component is respectively disposed on the surface of the first substrate or between the plurality of base materials.

According to this, by using a multi-layer substrate configuration where the substrate is a laminate of a plurality of base materials, without limiting the number of electronic components or wiring, it is possible to secure a space for forming these and a plurality of the electronic components and wiring are able to be excellently held.

In addition, there may be a configuration where at least a portion of the second substrate and the second electrode are disposed so as to wrap around to the first substrate side.

According to this, it is possible to prevent the entry of static electricity from the side of the electrical device.

In addition, there may be a configuration where a third substrate is provided on the rear surface of the first substrate, the first electrode is disposed between the first substrate and the third substrate, and the first electrode is electrically connected with a portion of the second electrode via an external connection terminal which is connected to the electronic component provided on the rear surface.

According to this, the first electrode is protected by the third electrode and it is possible to prevent deterioration of the electrodes and the like. In addition, since conduction between the first electrode and the second electrode is performed at the rear surface side of the first substrate, it is possible to use all of a desired functional region.

In addition, there may be a configuration where at least a portion of the second substrate and the second electrode are disposed to wrap around onto the rear surface of the first substrate and the first electrode is electrically connected to a portion of the second electrode via an external connection terminal which is connected to the electronic component provided on the rear surface.

According to this, since at least a portion of the second substrate and the second electrode are disposed to wrap around onto the rear surface of the first substrate and conduction between the first electrode and the second electrode is performed at the rear surface side of the first substrate, it is possible to use all of a desired functional region.

In addition, there may be a configuration where the first electrode is embedded in the first substrate.

According to this, it is possible to prevent deterioration of and damage to the electrode due to the first electrode being embedded in the first substrate.

In addition, there may be a configuration where the first electrode is provided on the rear surface of the first substrate.

According to this, the configuration where the first electrode is provided on the rear surface of the first substrate is easy to be manufactured.

In addition, there may be a configuration where a connection section which electrically connects the first electrode and the second electrode is formed along at least one side of the first substrate and the second substrate.

According to this, due to the connection section serving the role of a moisture barrier, a moisture prevention effect is able to be obtained with regard to the functional layer, the electronic apparatus, and the like and it is possible to prevent breakdowns thereof.

In addition, there may be a configuration where the connection section which electrically connects the first electrode and the second electrode is formed in at least one corner of a region where the functional element which is held between the first substrate and the second substrate exists.

According to this, since it is possible to obtain conduction between the first electrode and the second electrode in a region which includes at least one corner portion of the region where the functional element exists, it is possible to reliably obtain conduction between the first electrode and the second electrode in a smaller region.

In addition, there may be a configuration where one out of a pair of electrodes which interpose the functional element is the second electrode, the other is a plurality of third electrodes (pixel electrodes) which are formed on a surface on the functional element side of the first electrode, and the electronic component is connected to the plurality of third electrodes via a plurality of connection wirings.

According to this, it is possible to simultaneously drive the plurality of third electrodes via the electronic component and it is possible to increase the speed of rewriting a screen since writing of a plurality of pixels which configure one screen as one block is possible. In addition, a switching element which performs a switching operation for applying a voltage with regard to the third electrode is not necessary. Due to this, the configuration is simplified and manufacturing is easy.

In addition, there may be a configuration where the electronic component is an electronic circuit and a protection circuit is provided between the output terminal of the electronic circuit and the first electrode.

According to this, since the protection circuit is provided between the output terminal of the electronic component and the first electrode, in a case where a predetermined difference in potential is generated between the output terminal and the first electrode, it is possible to short between the output terminal and the first electrode and reduce the difference in potential therebetween. Due to this, it is possible to prevent electrostatic damage to the electronic component.

In addition, the connection section may be configured from a plurality of wiring sections which are formed on different base materials and a plurality of contact holes which are formed on different base materials, connect the plurality of wiring sections, and do not overlap in a planar view.

According to this, there is a connection section with a wave shape in a cross-sectional view and a moisture prevention effect is further increased.

In addition, there may be a configuration where the functional element is an electro-optical element.

According to this, it is possible to obtain an electro-optical device which is able to suppress the generation of defects due to static electricity and reliably obtain a desired function.

BRIEF DESCRIPTION OF THE DRAWINGS

The invention will be described with reference to the accompanying drawings, wherein like numbers reference like elements.

FIG. 1A is a cross-sectional diagram along line IA-IA of FIG. 1B.

FIG. 10 is a partial enlarged cross-sectional diagram illustrating in detail a configuration of the electrophoretic display device of the fifth embodiment.

FIGS. 11A to 11D are diagrams illustrating a process during folding of a sheet substrate in the manufacturing of the electrophoretic display device of the fifth embodiment.

FIG. 12 is a cross-sectional diagram illustrating a schematic configuration of an electrophoretic display device of a sixth embodiment.

FIGS. 13A to 13E are diagrams illustrating a process during folding of a sheet substrate in the manufacturing of the electrophoretic display device of the sixth embodiment.

FIG. 16 is a cross-sectional diagram illustrating a schematic configuration of an electrophoretic display device of an eighth embodiment.

FIG. 21A is a planar diagram, and FIG. 21B is a cross-sectional diagram along a line XXIB-XXIB of FIG. 21A.

DESCRIPTION OF EXEMPLARY EMBODIMENTS

Below, the embodiments of the invention will be described with reference to the attached diagrams. Here, in each of the diagrams which are used in the explanation below, the dimensions of each member are appropriately changed in order that each member be a recognizable size.

First Embodiment

Electrophoretic Display Device

Figure 1A:
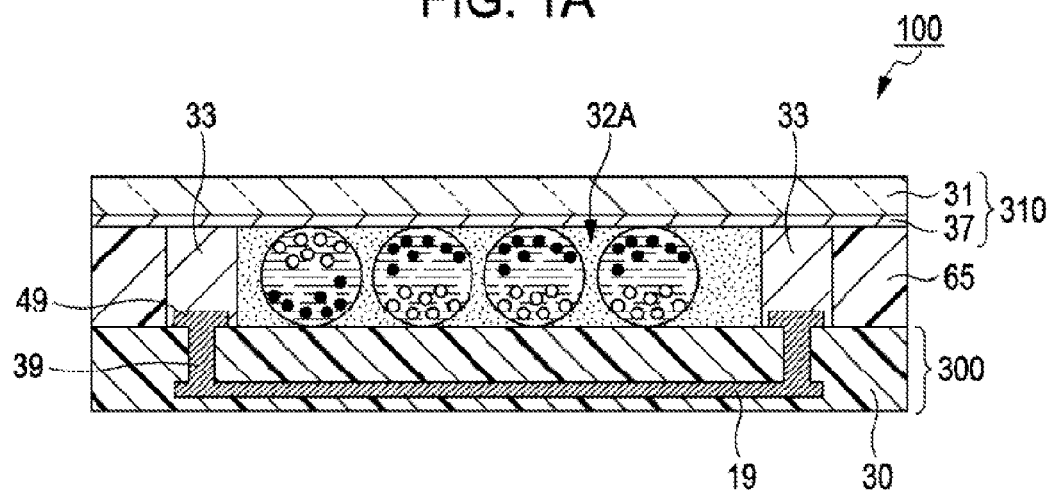
FIGS. 1A and 1B are diagrams schematically illustrating an overall configuration of an electrophoretic display device which is a first embodiment of the electrical device of the invention.
Figure 1B:
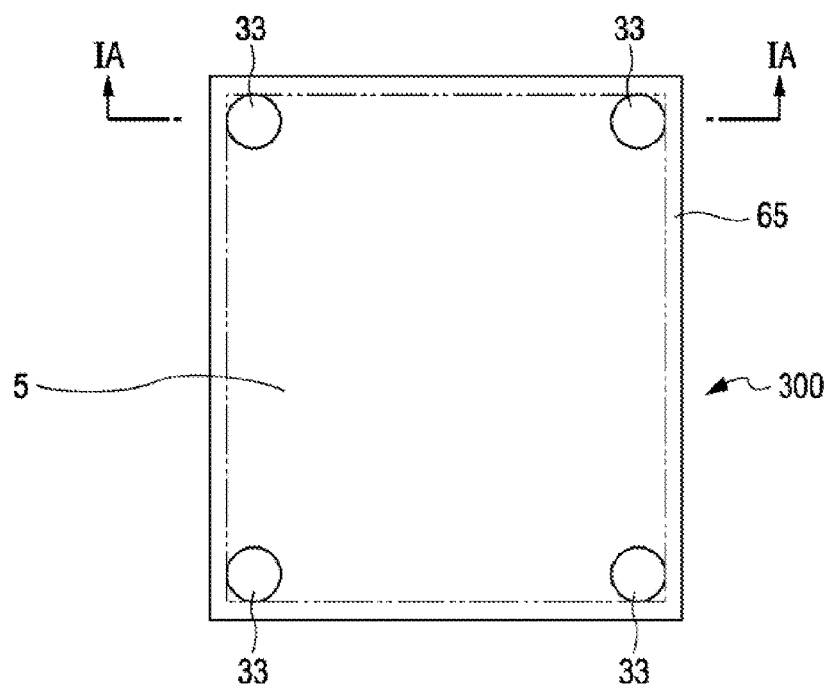
Figure 2:
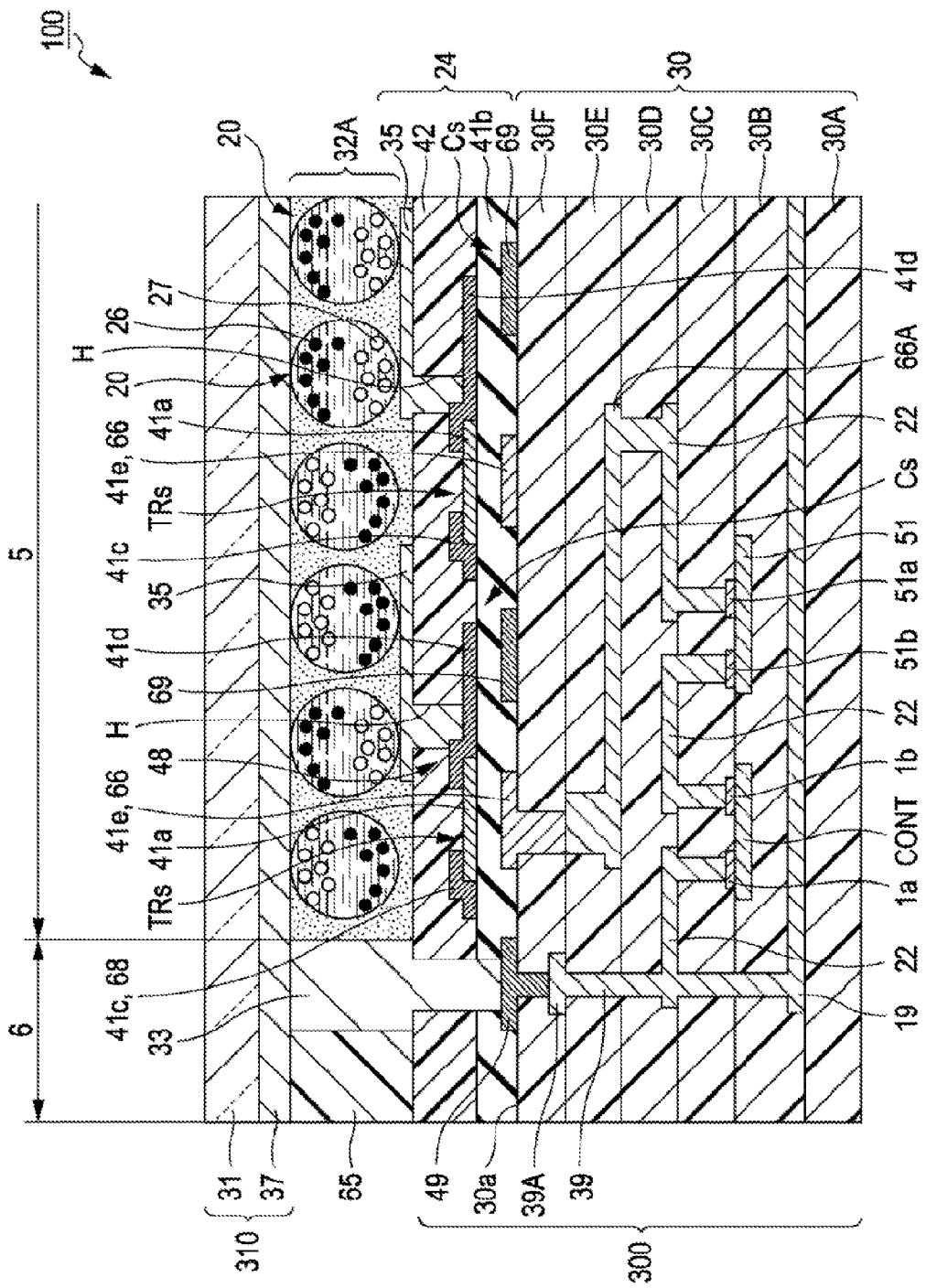
FIG. 2 is a cross-sectional diagram illustrating a specific configuration of an electrophoretic display device or a cross-sectional diagram specifically illustrating a configuration of the electrophoretic display device of the embodiment.
Figure 3:
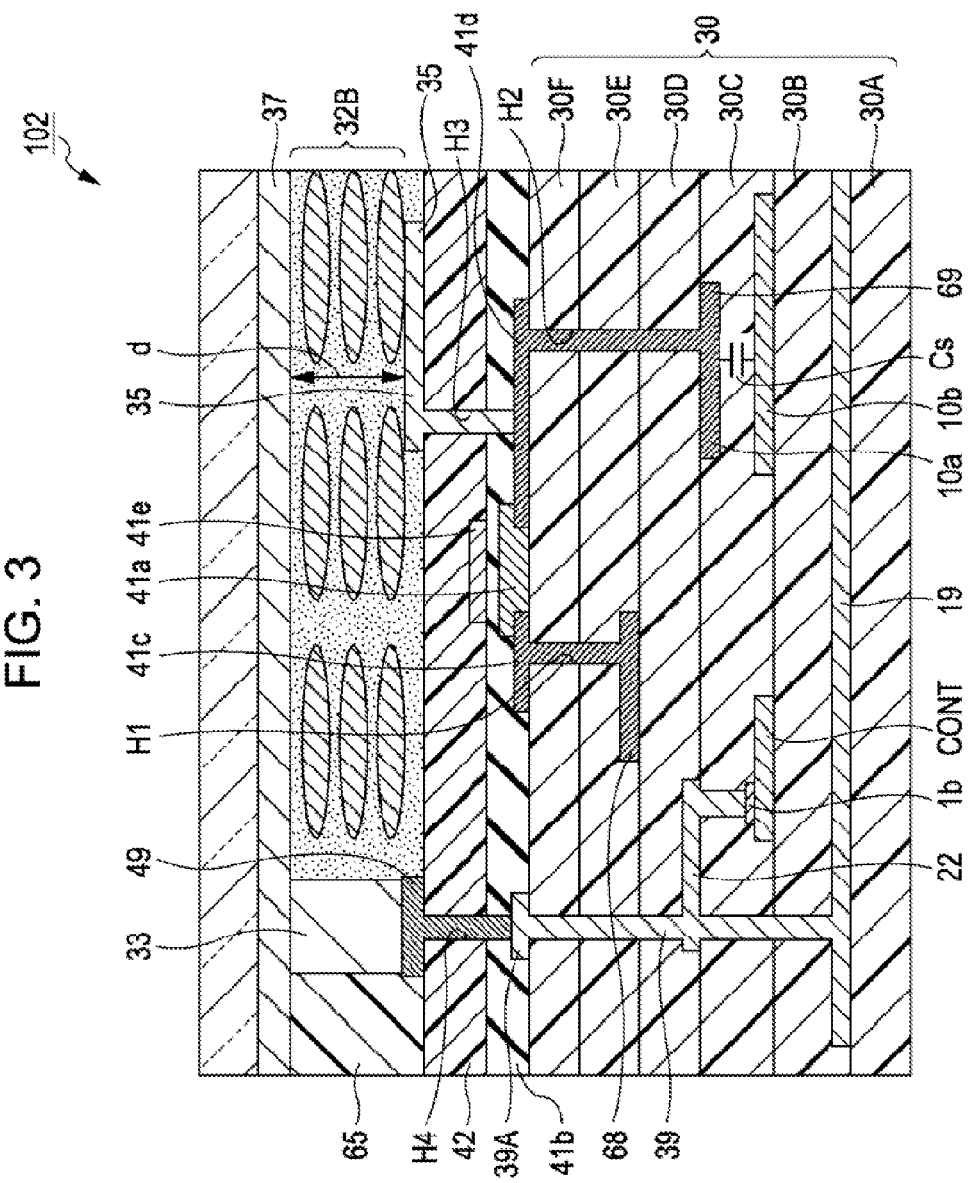
FIG. 3 is a cross-sectional diagram illustrating a configuration of a liquid crystal display device or a cross-sectional diagram illustrating an overall configuration of the liquid crystal display device which is a second embodiment of the electrical device of the invention.

FIGS. 1A and 1B are diagrams schematically illustrating an overall configuration of an electrophoretic display device which is a first embodiment of the electrical device of the invention, and FIG. 1A is a cross-sectional diagram along IA-IA of FIG. 1B. FIG. 2 is a cross-sectional diagram illustrating a specific configuration of an electrophoretic display device. FIG. 3 is a cross-sectional diagram illustrating a configuration of a liquid crystal display device.

An opposing electrode 37 is a common electrode of an electrophoretic layer 32A and is used in driving the electrophoretic layer 32A.

As shown in FIGS. 1A and 1B, an electrophoretic display device (electrical device) 100 of the embodiment is configured to be provided with an element substrate 300 which is formed from a semiconductor device, an opposing substrate 310 which is disposed to oppose the element substrate 300, and an electrophoretic layer (functional element) 32A which is interposed between the element substrate 300 and the opposing substrate 310 which are flexible.

A sealing material 65 is disposed so as to enclose the circumference of the electrophoretic layer 32A in order to secure resistance to moisture with regard to the electrophoretic layer 32A between the periphery portions of each of the element substrate 300 and the opposing substrate 310.

In the embodiment, a rear surface electrode (first electrode) 19 which has a rectangular shape in a planar view is embedded in a first substrate 30 which configures the element substrate 300. The rear surface electrode 19 has a rectangular shape in a planar view and is disposed on a rear surface side of the first substrate 30. The rear surface electrode 19 is connected to a connection section 39, which is positioned in four corner portions thereof and is embedded in the first substrate 30, and an up and down conduction section 33, which is disposed between the element substrate 300 and the opposing substrate 310 via an up and down conduction terminal 49 which is provided on the front surface of the first substrate 30.

The up and down conduction section 33 exists to the outer side of the electrophoretic layer 32A and more to an inner side than the sealing material 65, one edge side is connected to the up and down conduction terminal 49, and the other edge side is connected to the opposing electrode (second electrode) 37. Due to this, there is a configuration where the rear surface electrode 19 and the opposing electrode 37 are electrically connected. The opposing electrode 37 is the common electrode and is used in driving the electrophoretic layer 32A.

Next, the configuration of the electrophoretic display device of the embodiment will be described in a specific manner.

FIG. 2 is a cross-sectional diagram specifically illustrating a configuration of the electrophoretic display device of the embodiment.

As shown in FIG. 2, the element substrate 300 is mainly configured by the first substrate 30 and a driving circuit layer 24 which is formed on the front surface thereof and is provided with the rear surface electrode 19 which is embedded in an inner portion of the first substrate 30 in the embodiment.

The first substrate 30 is a laminate of six base materials 30A, 30B, 30C, 30D, 30E, and 30F which have flexibility, and the rear surface electrode 19, a scanning line driving Dr-IC (electronic component) 51, a data line driving Dr-IC (electronic component) which is not shown, a controller (electronic component) CONT, various types of wiring, and the like are embedded in the base materials 30A to 30F. The various types of wirings (a gate connection line 66A, a connection wiring 22, and the like) which are embedded in the first substrate 30 are configured from Cu with a thickness of 10 μm. In addition, each of the base materials 30A to 30F is a flexible substrate which is formed from polyimide with a thickness of 50 μm. Since a user visually recognizes the image from the opposing substrate 310 side, the first substrate 30 may be a substrate which is not transparent.

Specifically, it is preferable that a substrate which is not transparent be used as the base material 30B where the scanning line driving Dr-IC 51, the data line driving Dr-IC, and the controller CONT which are electronic components are embedded. Due to the imparting of a light blocking property to the base material in the vicinity of the electronic components, it is possible to suppress erroneous operations in the electronic components due to light leaking.

The driving circuit layer 24 has a pixel element (third electrode) 35 for each of a plurality of pixels disposed in a matrix formation which configures an image display region 5 of the electrophoretic display device 100 and a control transistors TRs which controls the pixel electrodes 35, and the pixels are provided at each location where a plurality of scanning lines 66 and a plurality of data lines 68A and 68B intersect. Then, out of the control transistors TRs, a portion of the scanning lines 66, which are disposed so as to oppose a channel region of a semiconductor layer 41a, function as a gate electrode 41e. The control transistors TRs are organic TFTs which have a bottom gate/top contact configuration and an organic semiconductor layer.

The driving circuit layer 24 described above is provided on the first substrate 30, but the plurality of the scanning lines 66, the plurality of the data lines 68A and 68B, and a plurality of holding capacitance lines 69 which are disposed in the image display region 5 are formed on a front surface 30a of the first substrate 30, and furthermore, in the embodiment, the up and down conduction terminal 49 which is disposed at the four corners of the first substrate 30 is formed in the image display region 5. These are formed from Cu with a thickness of 0.5 μm by being formed by patterning in the same process.

A gate insulating film 41b is provided over the entire front surface of the first substrate 30 so as to cover the scanning lines 66 (gate electrode 41e), the plurality of holding capacitance lines 69 and the up and down conduction terminal 49. The gate insulating film 41b is formed from polyimide with a thickness of 0.5 μm and the semiconductor layer 41a which is formed from pentacene with a thickness of 0.05 μm is formed thereon. A source electrode 41c and a drain electrode 41d which are formed from Au with a thickness of 0.2 μm are further provided on the gate insulating film 41b so that a portion is on top of a periphery portion of the semiconductor layer 41a. The semiconductor layer 41a, the source electrode 41c, and the drain electrode 41d are covered by a protection layer 42 which is formed from acryl with a thickness of 1 μm and the pixel electrode 35 is electrically connected to a lower layer of the drain electrode 41d via a contact hole H which penetrates through the protection layer 42 in a thickness direction. The contact hole H is formed by not depositing the protection layer 42 in the formation region thereof. The control transistors TRs are formed by sequentially forming a thin film from the first substrate 30 side.

The data lines 68A and 68B which supply an image signal are electrically connected to the source electrode 41c of the control transistors TRs. Here, the image signal which is written into the data lines 68A and 68B may be sequentially supplied in lines or may be supplied for each group or for each single data line with regard to the data lines 68A and 68B which are adjacent to each other.

In addition, the scanning line 66 is electrically connected in the gate electrode 41e of the control transistor TRs and is configured so that a selection signal (scanning signal) is applied sequentially in lines in pulses at a predetermined timing.

The pixel electrode 35 which is formed on a front surface of the first substrate 30 is electrically connected to the drain electrode 41d of the control transistor TRs and the image signal which is supplied from the data lines 68A and 68B is written in at a predetermined timing with regard to the electrophoretic layer 32A due to the control transistor TRs which is a switching element being in an open state.

The electrophoretic layer 32A has a plurality of microcapsules 20. The plurality of microcapsules 20 are capsules with a substantially spherical shape where two types of electrophoretic particles of black and white which are either charged as positive or negative (positively charged particles 26 and negative charged particles 27) and a dispersion medium 21 are enclosed. The electrophoretic particles (positively charged particles 26 and negative charged particles 27) move to the opposing electrode 37 side or the pixel electrode 35 side due to a difference in potential in the pixel electrode 35 and the opposing electrode 37 which is formed by a holding capacitance Cs (not shown) and the electrophoretic layer 32A forms an image due to the distribution state of the electrophoretic particles which are visually recognized when the electrophoretic layer 32A is viewed from the opposing substrate 310 side.

Here, since the image signal which is held prevents leaking, the holding capacitance Cs is added in parallel with a capacitance which is formed between the pixel electrode 35 and the opposing electrode 37. The holding capacitance Cs is formed between the drain electrode 41d of the control transistor TRs and the holding capacitance line 69 which supplied a low potential.

Here, not limited to an example where electrophoretic material of a capsule type are used, for example, there may be a partition such as a separating wall which segments a space between the first substrate 30 and the second substrate 31 or there may not be a partition. In addition, a particle configuration other than the two black and white particles which are charged with different polarities may be adopted.

The rear surface electrode 19 is electrically connected with the up and down conduction terminal 49 on the front surface of the base material 30F, that is, the front surface 30a of the first electrode 30 via the connection section 39 which is formed in a via which is disposed on the base material 30A, passes through the base materials 30B to 30E, and penetrates these in a thickness direction and via a relay terminal 39A which is formed by patterning in the surface of the base material 30E.

The scanning line driving Dr-IC 51 (electronic component 10) for supplying the scanning signal, which is for driving the control transistor TRs, to the scanning line 66, the data line driving Dr-IC (not shown: electronic component 10) which controls the circuit which supplies the image signal to the data lines 68A and 68B, and the controller CONT which controls each of the Dr-ICs are embedded between the base material 30B and the base material 30C.

The output side of the scanning line driving Dr-IC 51 (output terminal 51a) is connected to the plurality of scanning lines 66 via the connection wiring 22 and the gate connection line 66A which are embedded in the first substrate 30 and controls the timing when the scanning signal is supplied with regard to each of the scanning lines 66. On the other hand, the input side (input terminal 51b) is connected to the output side (output terminal 1b) of the controller CONT via the connection wiring 22. The data line driving Dr-IC are the same.

In this manner, there is a configuration where the frame edge width, that is, a non-display region 6 is made to be narrower by the scanning line driving Dr-IC 51 and the data line driving Dr-IC being embedded in the first substrate 30 in a range of the image display region 5 without being disposed in the periphery of the image display region 5.

In addition, the four up and down conduction sections 33 which are described above are provided in the image display region 5 and the rear surface electrode 19 on the element substrate 300 side and the opposing electrode 37 on the opposing substrate 310 side is electrically connected using the four up and down conduction sections 33.

The sealing material 65 which is formed from epoxy resin is provided in the non-display region 6 so as to fill in a gap between the element substrate 300 and the opposing substrate 310 and the sealing material 65 seals the periphery of the electrophoretic layer 32A.

As the up and down conduction section 33, the forming of a metal paste such as Ag or Cu in a predetermined shape, the holding of a material where a plastic surface with a spherical shape is coated with a metal in an organic material, an anisotropic conductive film, or the like is used.

The up and down conduction section 33 is provided in the four corners of the image display region 5 in FIG. 1B but is not limited thereto. The up and down conduction section 33 may be provided in one or more out of the four corners or in a thin long shape along a side.

In the opposing substrate 310, the opposing electrode 37 formed from carbon nanotubes with a thickness of 0.1 μm is formed on the second substrate 31 which is transparent and formed from PET with a thickness of 0.2 μm and a transparent substrate is used as the second substrate 31 since the user views the electrophoretic layer 32A via the opposing substrate 310.

The application of a voltage to the opposing electrode 37 is performed by the controller CONT. The connection section 39 is connected in the output terminal 1b of the controller CONT via the connection wiring 22. That is, there is a configuration where a predetermined voltage is input from the controller CONT to the opposing electrode 37 via the connection section 39, the relay terminal 39A, the up and down conduction terminal 49, and the up and down conduction section 33.

Due to the configuration where the rear surface electrode 19 is electrically connected to the opposing electrode 37 in the electrophoretic display device 100 of the embodiment, the rear surface element 19 and the opposing electrode 37 are the same voltage. The rear surface electrode 19 is formed with a size according to at least the image display region 5 and the control transistors TRs and the electronic component 10 are disposed in a space formed between the rear surface electrode 19 and the opposing electrode 37. Due to the configuration, suppression of breakdowns due to static electricity from the outside is possible due to the control transistor TRs and the electronic component 10 being shielded by the rear surface electrode 19 and the opposing electrode 37 which are electrically connected to each other. That is, it is difficult for damage to occur since a high voltage is not applied to the control transistor TRs, the electronic component 10, and the like even if a high potential is applied to the opposing electrode 37 and the rear surface electrode 19. Furthermore, there is also a function of an EM shield for suppressing damaging electromagnetic (EM) radiation.

The four sides of the electrophoretic display device 100 are not shielded in the configuration in the embodiment since the up and down conduction section 33 is only disposed at the four corners of the element substrate 300, but there is hardly any static electricity which gets in from the side since the front and rear surfaces of the electrophoretic display device 100 are shielded by the opposing electrode 37 and the rear surface electrode 19.

In addition, as means by which a voltage is applied to the opposing electrode 37 in the embodiment, the controller CONT is used but is not limited thereto, and there may be a configuration where the voltage is output from a Dr-IC or a battery.

In addition, the sealing material 65 which is formed from epoxy resin is used in the embodiment, but an organic material such as acryl may be used.

In addition, as the charged particles, color particles other than white and black particles may be used and a light emitting material such as a liquid crystal material or OLED may be used as the electro-optical element.

In addition, the number of the up and down conduction sections 33 is not limited to four. In addition, the shape thereof is not limited to that described above and the up and down conduction section 33 may be formed in a line shape.

Furthermore, the configuration of the control transistor TRs is not limited to the bottom gate configuration. The control transistor TRs may use either an organic or inorganic transistor. In addition, the materials which are used for the control transistor TRs, the first substrate 30, the second substrate 31, or the opposing electrode 37 are not limited to that described above.

In addition, the material which is used in the first substrate 30 which configures the element substrate 300 and the second substrate 31 of the opposing substrate 310 may use polyester or another organic or inorganic material which has flexibility. In addition, if it does not have flexibility, phenol paper, epoxy paper, glass composite, glass epoxy, thin glass, Teflon (registered trademark) ceramics, a composite of these, or another organic or inorganic material may be used.

In addition, as the material which is used in the first substrate 30 and the second substrate 31, there may also be a material which extends and retracts. Due to this, it is possible to realize flexibility which includes expansion and contraction states. For example, a soft organic material such as acryl and a non-woven fabric or a woven fabric which is coated with this, rubber, or the like may be used. When having an expansion and contraction property, it is possible to not only dispose an electro-optical device by adhering on a material with considerable deforming such as a fabric such as clothing or on a complex surface shape without any gaps but it is also possible to reduce peeling due to deforming when used.

In addition, the number of base materials which configures the first substrate 30 is not limited to that described above.

In addition, the material of the control transistor TRs is not limited to that described above.

In addition, as the material which is used for the pixel electrode 35, the opposing electrode 37, the scanning line 66, the data lines 68A and 68B, the connection wiring 22, and the like, a metal paste other than Cu paste, a conductive material such as metal or carbon nanotubes, an inorganic conductive material, an organic conductive material, a transparent substrate, or a conductive paste may be used.

Second Embodiment

Liquid Crystal Display Device

FIG. 3 is a cross-sectional diagram illustrating an overall configuration of the liquid crystal display device which is a second embodiment of the electrical device of the invention.

As shown in FIG. 3, a liquid crystal display device (electrical device) 102 adopts a liquid crystal layer (functional element) 32B instead of the electrophoretic layer of the electrophoretic display device which is described above. In the embodiment, the point that the data lines 68A and 68B and the holding capacitance Cs are embedded in the first substrate 30 and the point that the control transistor TRs is a top gate/bottom contact configuration is different from the previous embodiment. The holding capacitance Cs is configured from a holding capacitance line 93, a holding capacitance electrode 92, and the base material 30C which is held therebetween.

As shown in FIG. 3, the rear surface electrode 19, the controller CONT, the holding capacitance Cs, the data lines 68A and 68B are embedded in the first substrate 30 of the liquid crystal display device 102. In the source electrode 41c of the control transistor TRs which is formed on the front surface of the first substrate 30, the data lines 68A and 68B which are disposed on the substrate 30D are electrically connected via a contact hole H1 which is formed in the base materials 30E and 30F out of the plurality of base materials 30A to 30F which configure the first substrate 30.

The rear surface electrode 19 is disposed between the base material 30A and the base material 30B out of the plurality of base materials 30A to 30F which are laminated to configure the first substrate 30. In addition, in the controller CONT which is disposed on the front surface of the base material 30B (the surface on the side opposite to the base material 30A), since the output terminal 1b is connected to the connection section 39 via the connection wiring 22 on the base material 30C, a predetermined potential is input to the opposing electrode 37 from the controller CONT via the up and down conduction section 33.

Specifically, the voltage from the controller CONT is supplied to the opposing electrode 37 via the connection wiring 22, the connection section 39, the relay terminal 39A, the up and down conduction terminal 49, and the up and down conduction section 33 and is also supplied to the rear surface electrode 19 which is connected to an edge portion on a side opposite to an edge portion of the relay terminal 39A side of the connection section 39. Due to this, the rear surface electrode 19 and the opposing electrode 37 have the same potential and the space between the rear surface electrode 19 and the opposing electrode 37 is shielded.

The holding capacitance Cs is configured using a pair of electrodes 10a and 10b which are embedded in the first substrate 30 and capacitance is accumulated between the electrodes 10a and 10b. The electrode 10b which is one which configures the holding capacitance Cs is electrically connected to the drain electrode 41d of the control transistor TRs via a contact hole H2 which penetrates through the base materials 30D to 30F.

The gate insulating film 41b of the embodiment is deposited with a thickness of 0.4 μm so as to cover the source electrode 41c, the drain electrode 41d, the semiconductor layer 41a, which are formed so that a portion thereof is on top of the source electrode 41c and the drain electrode 41d, and the relay terminal 39A which are formed on the front surface of the first substrate 30. Out of the semiconductor layer 41a, the gate electrode 41e which is formed on the gate insulating film 41b so as to oppose the channel region is covered by the protection layer 42 which is formed on the gate insulating film 41b and configures the control transistor TRs.

The pixel electrode 35 which is disposed on the protection layer 42 is electrically connected to the drain electrode 41d of the control transistor TRs via a contact hole H3 which penetrates the protection layer 42 and the gate insulating film 41b in the thickness direction. Due to this, image display is performed by the image signal from the data lines 68A and 68B being supplied to the liquid crystal layer 32B via the control transistor TRs.

As the liquid crystals which configure the liquid crystal layer (functional layer) 32B, liquid crystals where optical characteristics hardly depend on a cell gap d such as guest host liquid crystals, PDLC (polymer dispersed liquid crystals), PNLC (polymer network liquid crystals), or IPS liquid crystals are appropriate. This is because, in a case where flexible substrates are used as the first substrate 30 which configures the element substrate 300 and the second substrate 31 which configures the opposing substrate 310, the cell gap d changes when the liquid crystal display device 102 is bent. As a result, it is desirable to use the liquid crystal material described above, but liquid crystal materials other than these are not problematic.

Here, in a case where the liquid crystal material is used, it is desirable that a volatile memory such as an SRAM is provided for each pixel since the liquid crystal material itself does not have memory characteristics.

Also with regard to the liquid crystal display device 102 of the embodiment, suppression of breakdowns due to static electricity from the outside is possible due to the control transistor TRs and the electronic component 10 being shielded by the rear surface electrode 19 and the opposing electrode 37 in the same manner of the previous electrophoretic display device 100. Accordingly, it is difficult for damage to occur since a high potential is not applied to the control transistor TRs, the electronic component 10, and the like even if a high voltage is applied to the opposing electrode 37 and a high quality display device is able to be obtained.

Modification

Figure 4:
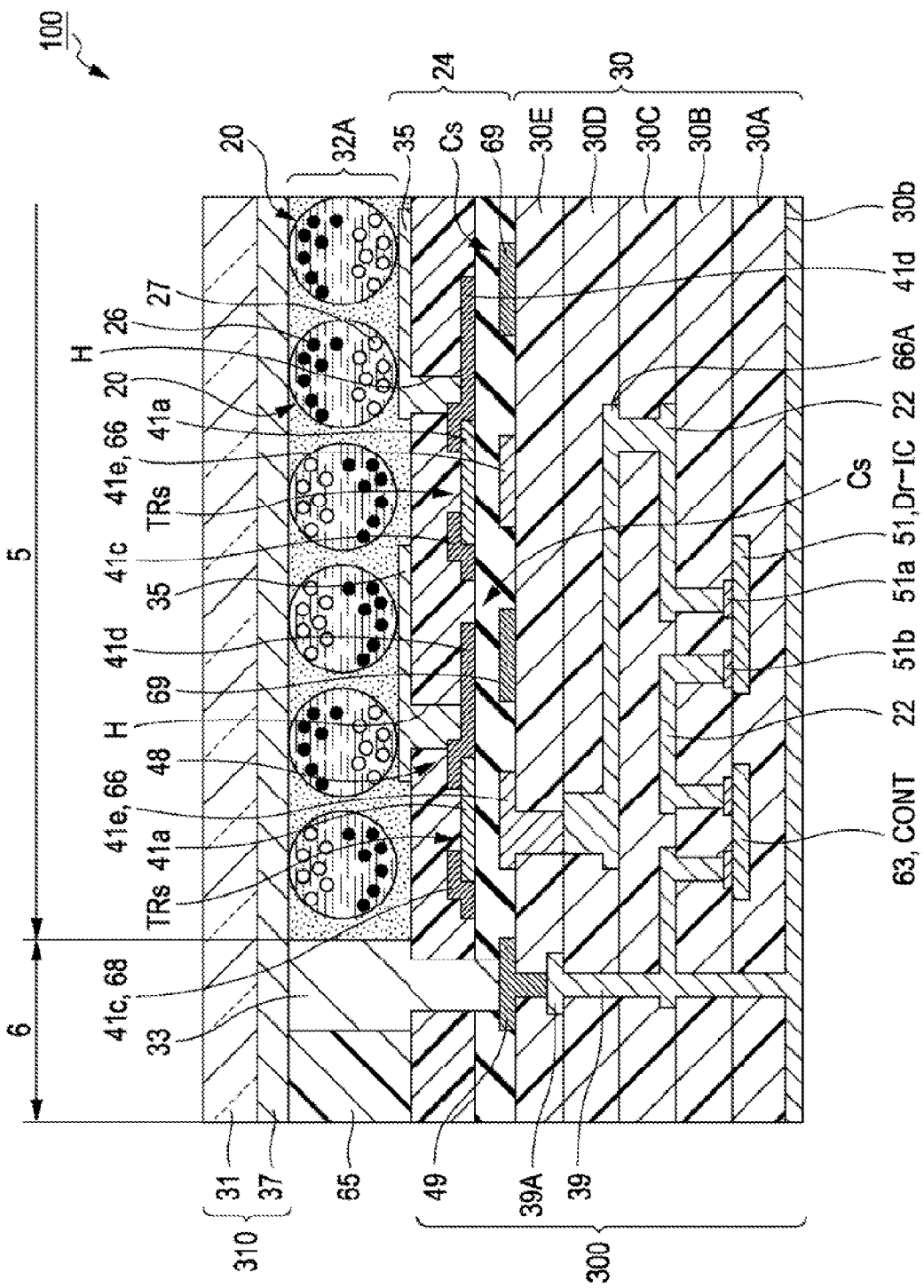
FIG. 4 is a cross-sectional diagram illustrating a modification of the first embodiment according to the invention.

FIG. 4 is a cross-sectional diagram illustrating a modification of the first embodiment according to the invention. Here, an example is shown in FIG. 4 where the electrophoretic layer is shown, but the modification may also be applied to the liquid crystal display device of the second embodiment which uses the liquid crystal layer.

As shown in FIG. 4, there may be a configuration where the rear surface electrode 19 is provided directly on a rear surface 30b of the first substrate 30 which configures the element substrate 300 and the rear surface element 19 is exposed from the first substrate 30.

In this manner, even if there is a configuration where the rear surface electrode 19 is exposed from the first substrate 30, it is possible to obtain a static electricity shielding effect with regard to the control transistor TRs and the electronic component 10 due to the rear surface electrode 19 and the opposing electrode 37. If there is this configuration, manufacturing is easily performed.

Here, there may be a configuration where the rear surface electrode 19 is not exposed as is but the rear surface electrode 19 is protected by a transparent insulating sheet or the like wrapping the entirety thereof.

Third Embodiment

Figure 5:
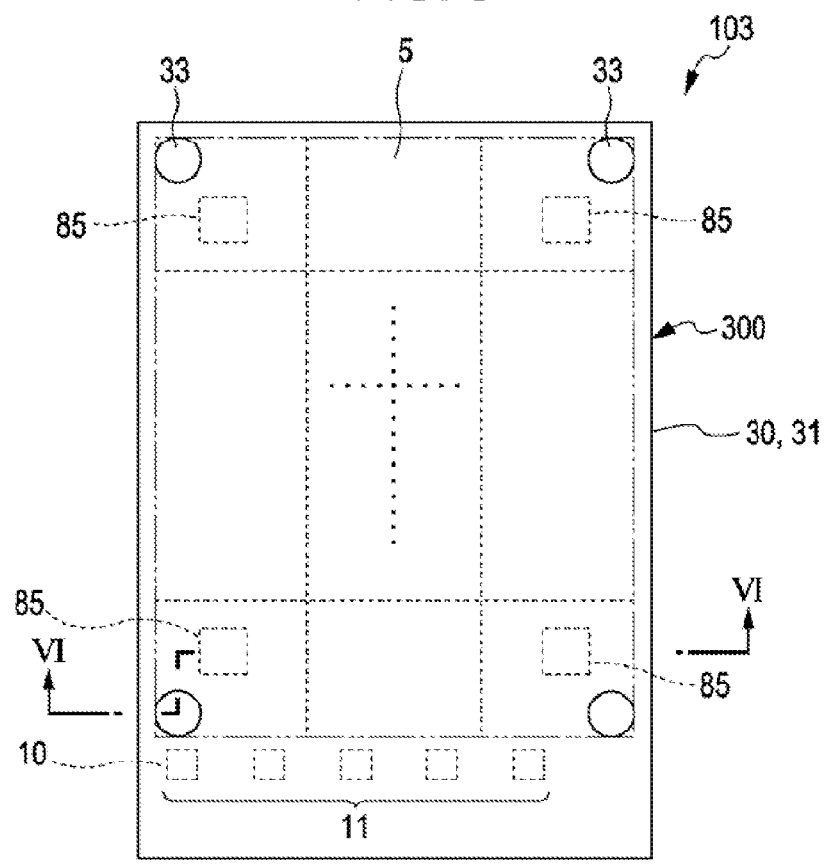
FIG. 5 is a planar diagram illustrating a schematic configuration of a third embodiment.
Figure 6:
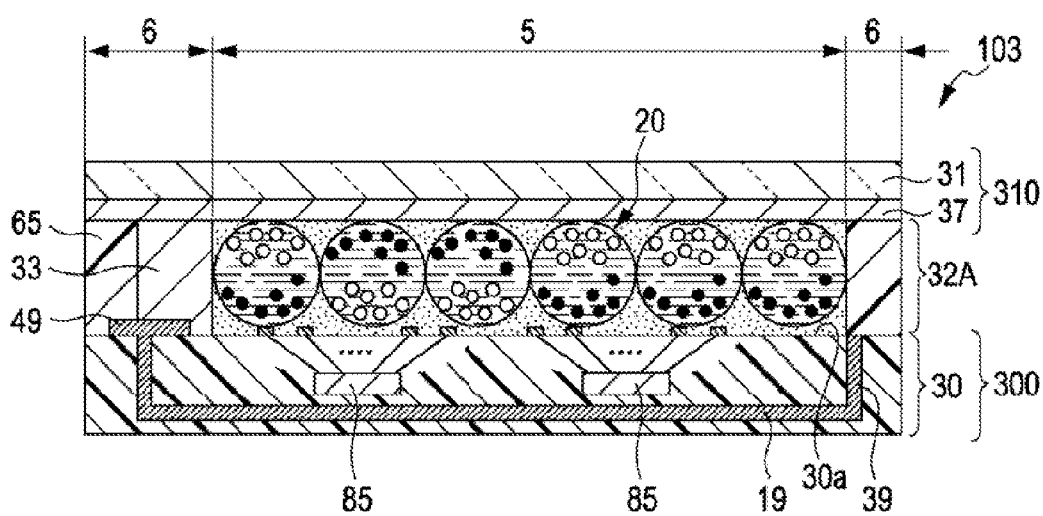
FIG. 6 is a cross-sectional diagram along a line VI-VI of FIG. 5.
Figure 7A:
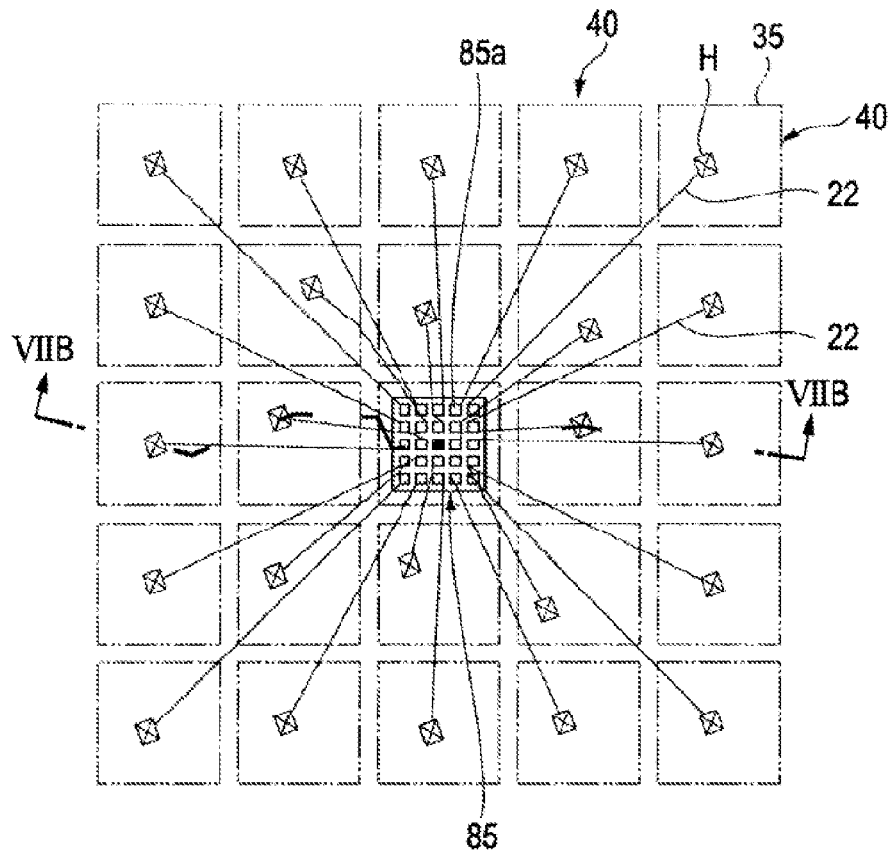
FIG. 7A is a planar diagram illustrating an enlargement of a portion (5×5 pixels) of an image display region and FIG. 7B is a cross-sectional diagram along a line VIIB-VIIB of FIG. 7A.

FIG. 5 is a planar diagram illustrating a schematic configuration of a third embodiment and FIG. 6 is a cross-sectional diagram along a line VI-VI of FIG. 5. FIG. 7A is a planar diagram illustrating an enlargement of a portion (5×5 pixels) of an image display region and FIG. 7B is a cross-sectional diagram along a line VIIB-VIIB of FIG. 7A.

As shown in FIGS. 5 and 6, in an electrophoretic device (electrical device) 103 of the embodiment, a plurality of driving drivers ICs 85, which directly drive the plurality of pixel electrodes 35 which are disposed in a matrix formation in the image display region 5, are embedded in the first substrate 30 instead of the control transistors TRS.

The element substrate 300 and the opposing substrate 310 which are formed from the first substrate 30 and the second substrate 31 which have flexibility are substantially the same shape and size and the electrophoretic layer 32A is interposed therebetween to form the image display region 5. In addition, an electronic circuit 11 which drives the plurality of driving driver ICs 85 which are embedded in the first substrate 30 is disposed in a region on the outer side of the image display region 5. The controller CONT is included in the electronic component 10.

Figure 7B:
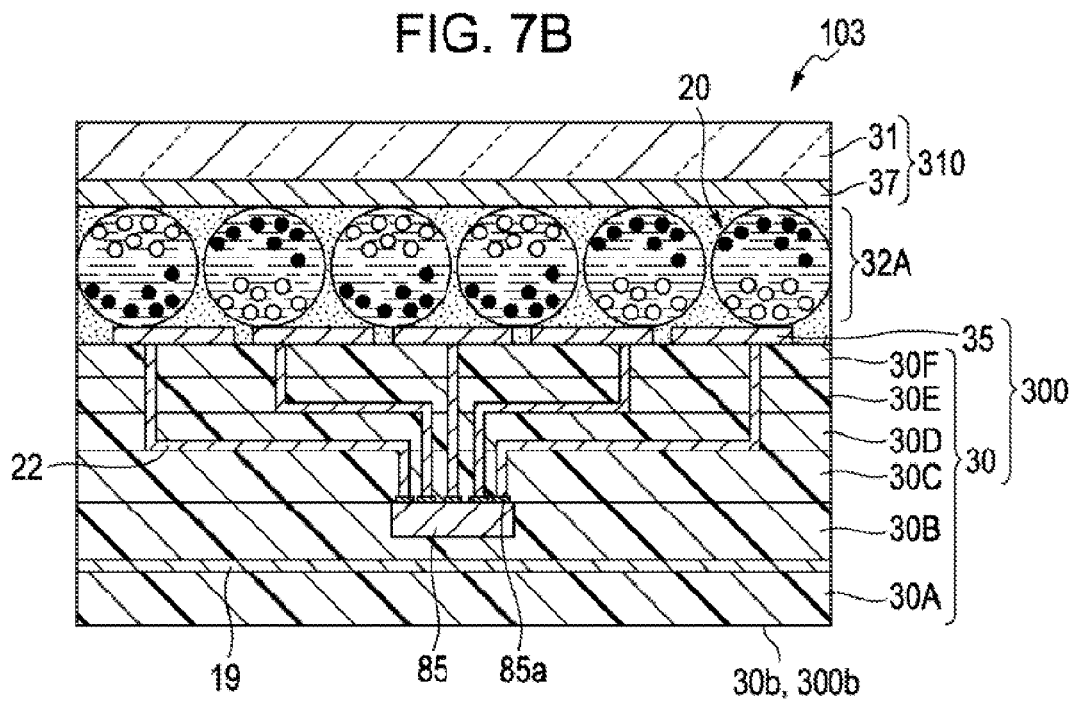

In the embodiment, as shown in FIGS. 7A and 7B, a predetermined number of the driving driver ICs (electronic components) 85, which are arranged at equal intervals to correspond to each of a plurality of pixels 40, are embedded in an inner portion of the first substrate 30 which configures the element substrate 300. The driving driver ICs 85 are disposed in a matrix formation of m×n to correspond to the arrangement of the pixels 40 and are formed so as to be able to individually drive each of the pixels. The number of pixels which are able to be displayed in the embodiment is, for example, 100×100. The driving driver IC 85 has a plurality of output terminals 85a (refer to FIGS. 7A and 7B) which correspond to the 100×100 matrix pixels on a surface thereof. The output terminal 85a of the driving driver IC 85 is directly connected to the pixel electrode 35 which is formed on the front surface 30a of the first substrate 30 using the connection wiring 22 which is formed in an inner portion of the first substrate 30. In this manner, by the driving driver IC 85 (the output terminal 85a) and the pixel electrode 35 being each directly connected using the connection wiring 22 without going via a control transistor or the like, it is possible to directly drive the pixel electrode 35.

Each of the driving driver ICs 85 are controlled based on a signal which is input from the electronic circuit 11 which is formed from a plurality of electronic components 10 which are mounted on the first substrate 30 and rewriting of a screen is executed by performing a block writing operation where the application of a voltage is performed with the plurality of pixel electrodes 35 as a block or a sequential writing operation where the writing of a sequential voltage is performed with regard to the plurality of pixel electrodes 35. Here, it is possible to reduce the time which is necessary for switching screens by the block writing operation being executed with regard to the plurality of pixel electrodes 35.

In addition, although not shown in the diagram, wiring which connects the driving driver IC 85 and the electronic circuit 11 is also embedded in a predetermined position in the same manner.

According to the embodiment, it is possible for the plurality of pixel electrodes 35 to be simultaneously driven via the driving driver IC 85. As a result, it is possible to perform block writing with regard to the plurality of pixel which configure one screen and it is possible to increase the speed of rewriting the screen. In addition, a switching element which performs a switching operation for applying a voltage with regard to the pixel electrode 35 is not necessary. Due to this, a reduction in size is realized and manufacturing is easy due to the simplification of the configuration.

Fourth Embodiment

Figure 8:
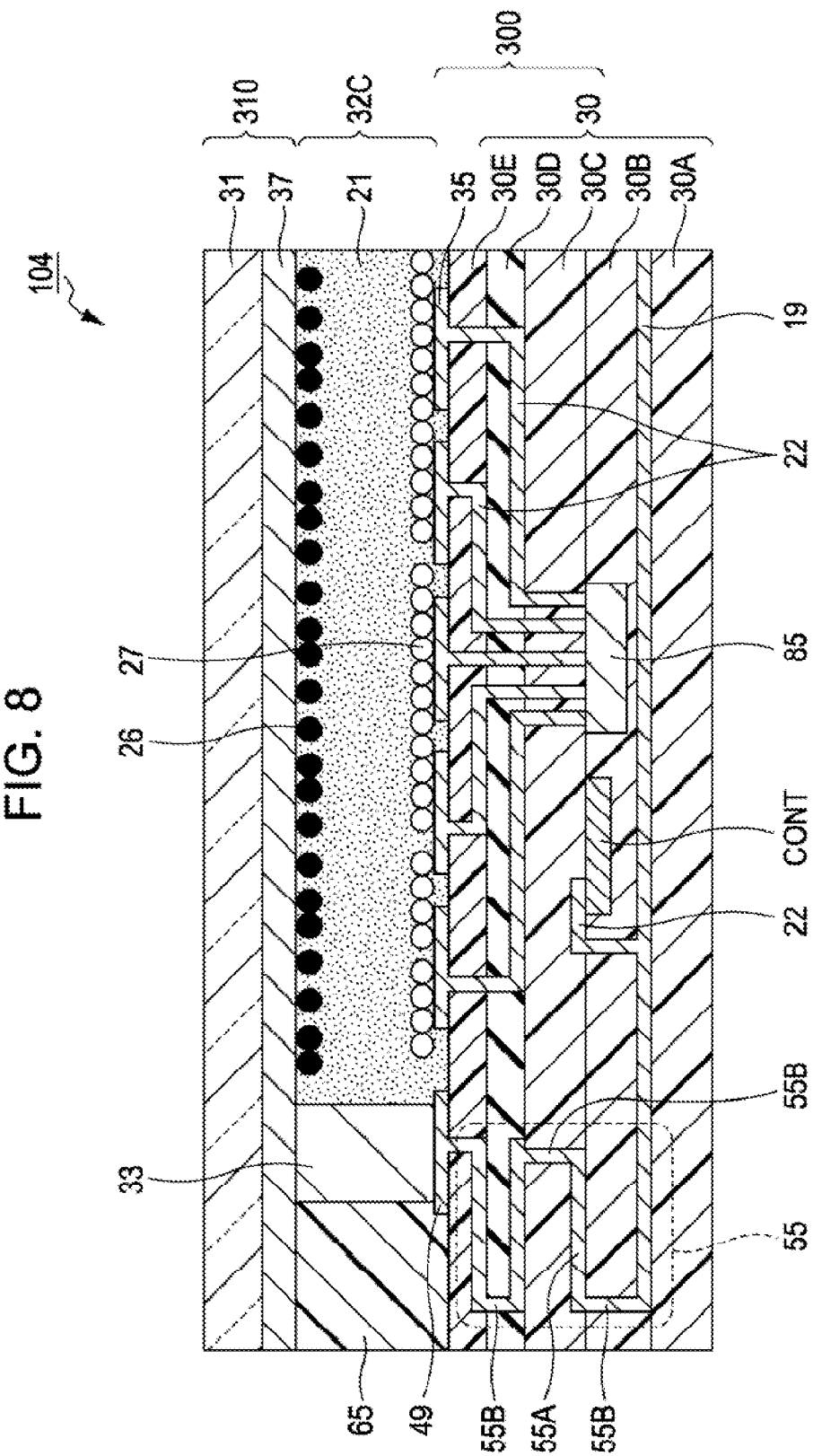
FIG. 8 is a cross-sectional diagram illustrating a schematic configuration of an electrophoretic display device of a fourth embodiment.

FIG. 8 is a partial cross-sectional diagram illustrating a schematic configuration of an electrophoretic display device of a fourth embodiment.

As shown in FIG. 8, in the electrophoretic display device 104 of the embodiment, the electrophoretic layer (functional element) 32C is formed with no partition between the element substrate 300 and the opposing substrate 310. In the previous embodiment, the electrophoretic layer which uses microcapsules is adopted, but in the electrophoretic layer 32C in the embodiment, the positively charged particles 26, the negatively charged particles 27, and the dispersion medium 21 are enclosed in a sealed space which is formed by the element substrate 300, the opposing substrate 310, and the sealing material 65 which is provided in a periphery portion thereof.

In addition, the driving driver IC 85 for directly driving the plurality of pixel electrodes 35 is embedded in the first substrate 30. There may be a configuration where the driving driver IC 85 is controlled by the controller CONT which is embedded in the first substrate 30.

The output side of the controller CONT is connected to the rear surface electrode 19 via the connection wiring 22 and a predetermined voltage is input into the rear surface electrode 19.

Typically, the characteristics of the electrophoretic material changes due to moisture. As a result, a moisture prevention configuration which suppresses the entry of water is necessary.

Therefore, a moisture barrier 55 is provided in the embodiment over all of the four sides of the first substrate 30 in a periphery portion of the element substrate 300 which corresponds to the non-display region. The moisture barrier 55 is formed using a metallic material such as Cu. Here, the formation material of the moisture barrier 55 is not limited to Cu.

The moisture barrier 55 is configured so as to be a wave shape in a cross-sectional view by using a connection wiring for connecting the rear surface electrode 19 and the opposing electrode 37 which is connected via the up and down conduction section 33. Specifically, wiring sections 55A which are disposed between the base materials 30A to 30E are disposed alternately so as not to match in a planar view in adjacent substrates and are connected using connection sections 55B which penetrate each of the base materials in the thickness direction. The moisture prevention with regard to the electrophoretic layer 32C, the controller CONT, and the driving driver IC 85 is increased. Due to this, it is possible to prevent breakage of each of the constituent elements and generation of defects.

Furthermore, a shield space which is surrounded by the rear surface electrode 19, the moisture barrier 55, the up and down conduction section 33, and the opposing electrode 37 is also formed and there is a configuration where there is a further increase in the effect where breakage due to the entry of static electricity from the outside with regard to the controller CONT, the driving driver IC 85, and the electrophoretic layer 32C which are disposed in the shield space is suppressed. Since the moisture barrier 55 is formed over all of the four sides of the first substrate 30, it is possible to prevent the entry of static electricity from the edges of the four sides of the element substrate 300.

In addition, since the four up and down conduction sections 33 which are formed from metal which is disposed between the element substrate 300 and the opposing substrate 310 is disposed only in the four corners of the display region, the sealing material 65 is disposed so as to fill in between the up and down conduction sections 33.

Here, the moisture barrier 55 is provided at least along one side of the first substrate 30 and is preferably provided along all four sides, and as a result, a high moisture prevention effect can be obtained.

Fifth Embodiment

No Rear Surface Electrode

Figure 9:
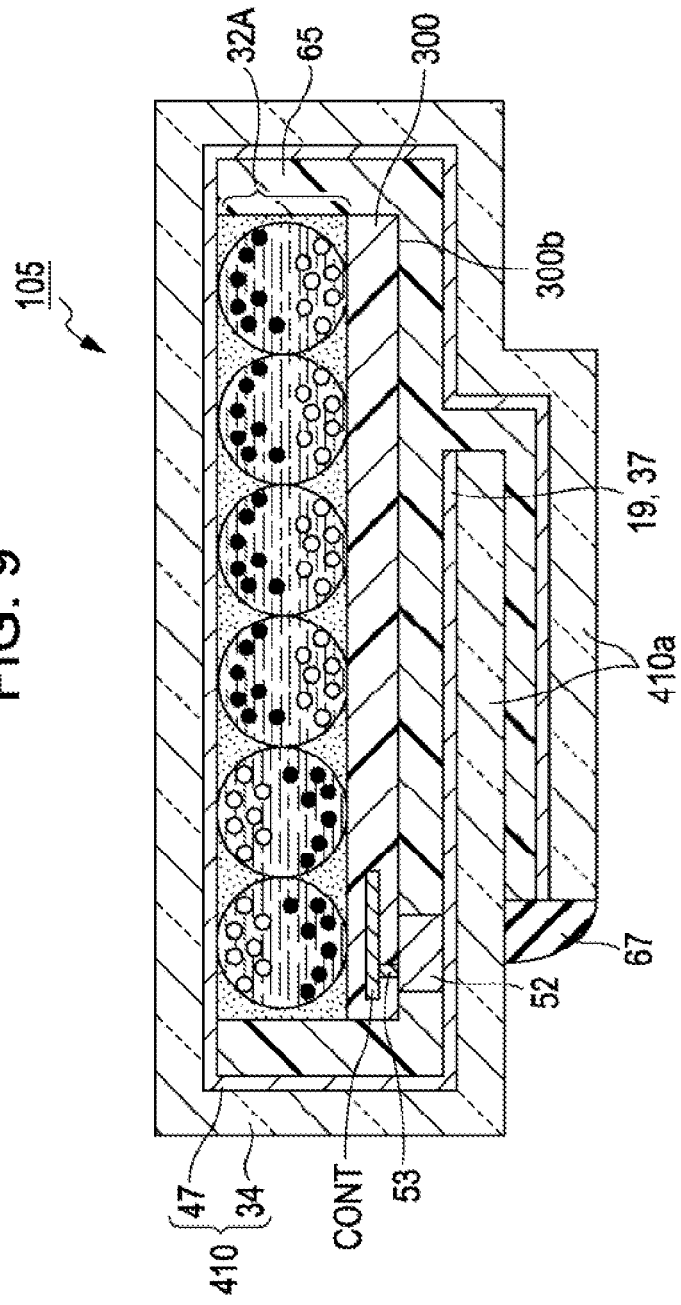
FIG. 9 is a cross-sectional diagram illustrating a schematic configuration of an electrophoretic display device of a fifth embodiment.

FIG. 9 is a cross-sectional diagram illustrating a schematic configuration of an electrophoretic display device of a fifth embodiment. FIG. 10 is a partial enlarged cross-sectional diagram illustrating in detail a configuration of the electrophoretic display device of the fifth embodiment.

As shown in FIGS. 9 and 10, the electrophoretic display device 105 of the embodiment has the element substrate 300 and a sheet substrate 410 which is configured so as to wrap around the periphery of the entire electrophoretic layer 32A which is disposed on the surface thereof. The sheet substrate 410 has an area which is larger than the element substrate 300 and is configured by a third substrate 34 which is formed from a PET substrate which is soft and a sheet electrode 47 which is formed on an inner surface of the third substrate 34 (the electrophoretic layer 32A side), and periphery edge portions 410a (all of the four sides of the sheet substrate 410) are disposed on a rear surface 300b by being folded more to the element substrate 300 side than the electrophoretic layer 32A from the softness thereof. The rear surface 300b of the element substrate 300 is a state which is entirely covered due to the sheet substrate 410 and the periphery edge portions 410a of the sheet substrate 410, which is disposed so as to be laminated with each other on the rear surface 300b of the element substrate 300, are enclosed using a sealing material 67 which has an insulation property. In addition, here, the sheet electrode 47 functions as the opposing electrode.

Here, all of the periphery edge portions 410a of the sheet substrate 410, that is, the four sides, may not be disposed on the rear surface 300b of the element substrate 300 and only one side or two or more sides may be disposed thereon.

An external connection terminal 53 (FIG. 10), which is connected to the output terminal 1b of the controller CONT which is embedded in the first substrate 30, is exposed in the rear surface 300b of the element substrate 300 and is electrically connected to the sheet electrode 47 of the sheet substrate 410 which is disposed on the rear surface 300b side of the element substrate 300 via a conduction section 52 which is provided in the sealing material 65 which connects the element substrate 300 and the sheet substrate 410.

That is, in the embodiment, a portion of the sheet electrode 47 which is disposed on the rear surface 300b side of the element substrate 300 functions as a rear surface electrode in each of the embodiments described above.

FIGS. 11A to 11D are diagrams illustrating a process during folding of the sheet substrate in the manufacturing of the electrophoretic display device of the fifth embodiment.

As shown in FIG. 11A, the element substrate 300 and the sheet substrate (second substrate) 410 which have different areas are prepared and the element substrate 300 is placed in the center portion of the sheet substrate 410. Here, the sheet substrate 410 is prepared so that the electrophoretic layer 32A is provided in advance in a predetermined region which corresponds to the image display region 5 on the sheet electrode (second electrode) 47. Or, the electrophoretic layer 32A may be provided in advance on the element substrate 300 side before adherence.

Then, after one edge portion 410A in the long-side direction of the sheet substrate 410 is folded onto the rear surface 300b of the element substrate 300 (FIG. 11B), another edge portion 410B is folded so as to overlap with the edge portion 410A (FIG. 11C). After this, both edge portions 410C in the short-side direction of the element substrate 300 are folded onto the rear surface 300b of the element substrate 300. In this manner, all of the four sides of the sheet substrate 410 are folded onto the rear surface 300b side of the element substrate 300.

There is a configuration in the embodiment where all of the four sides of the sheet substrate 410 are disposed on the rear surface 300b of the element substrate 300 and there is conductance between the controller CONT and the sheet electrode 47 on the rear surface 300b. In this manner, by there being a configuration where the electrical connection of the controller CONT and the sheet electrode 47 are performed only using the conduction section 52 and not via the rear surface electrode, a larger shield effect is able to be obtained with regard to the plurality of electronic components which are embedded in the first substrate 30, for example, the Dr-IC for driving the pixels (the scanning line driving Dr-IC 51 and the data line driving Dr-IC), the controller CONT, and the electrophoretic layer 32A since the fixing of the potential which is applied to the electrophoretic layer 32A is reliably performed.

In addition, since there is a configuration where the controller CONT and the sheet electrode 47 which are embedded in the first substrate 30 are electrically connected on the rear surface 300b of the element substrate 300, it is possible to obtain conductance over the whole region which includes the corner portions of the image display region 5.

Since the up and down conduction sections 33 are disposed in the corner portions of the image display region between the element substrate 300 and the sheet substrate 410 in the previous embodiment, it is not possible to perform image display in the corner portions, but according to the configuration of the embodiment described above, it is possible to display a predetermined image over the entire image display region 5 since the up and down conduction section 33 is on the rear surface.

In addition, it is possible to prevent the edge portions of the sheet electrode 47 from being exposed and prevent the deterioration of the sheet electrode 47 by the periphery edge portion 410a of the sheet substrate 410 being sealed by the sealing material 67. In addition, since the sealing material 67 is provided so as to cover the side surface of the sheet substrate 410, there is a configuration where the entry of water is prevented from a boundary with a portion of the periphery edge portion 410a which is laminated on the outermost side out of the periphery edge portions 410a of the sheet substrate 410 which are folded.

As the sealing material 67, a material which is the same as the sealing material such as epoxy or the like is used. Without being limited to this, other insulation materials may be used.

Here, it is not limited to using PET as the sheet substrate 410 as long as it is a flexible and transparent material. An organic material such as polyethylene, acryl, transparent polyimide may be used.

Sixth Embodiment

FIG. 12 is a cross-sectional diagram illustrating a schematic configuration of an electrophoretic display device of a sixth embodiment. FIGS. 13A to 13E are diagrams illustrating a process during folding of the sheet substrate in the manufacturing of the electrophoretic display device of the sixth embodiment.

As shown in FIG. 12, the electrophoretic display device 106 of the embodiment has the element substrate 300 and a sheet substrate 420 with flexibility which has an area larger than the element substrate 300 and is configured to be provided with a protection substrate (third substrate) 430 which is disposed on the rear surface 300b side of the element substrate 300.

The sheet substrate 420 is disposed on a rear surface 430b of the protection substrate 430 by each side of all (four sides) of entire periphery edge portions 420a being sequentially folded onto the rear surface 300b side of the element substrate 300 as shown in FIGS. 13A to 13E. On the rear surface 300b side of the element substrate 300, the periphery edge portion 420a on the sheet substrate 420 side is disposed so as to overlap with a periphery edge portion of the protection substrate 430 and a center portion of the protection substrate 430 is a state of being exposed.

An electrode (first electrode) 43, which is provided at an inner surface side of the protection substrate 430, is connected to an output terminal of a controller which is embedded in the first substrate 30 and is electrically connected via the external connection terminal 53 and the conduction portion 52 which are provided on the rear surface 300b of the element substrate 300. Due to this, there is a configuration where the sheet electrode 47 of the sheet substrate 420 and the electrode 43 of the protection substrate 430 are electrically connected and the same potential is input to the sheet electrode 47 and the electrode 43 using the controller CONT in the first substrate 30.

In the manufacturing of the electrophoretic display device 106 of the embodiment, the element substrate 300 and the sheet substrate 420 which has an area larger than the element substrate 300 are prepared, and after the element substrate 300 is placed in the center portion of the sheet substrate 420 (FIG. 13A), the protection substrate 430 is disposed on the rear surface 300b thereof (FIG. 13B). After this, the periphery edge portions 420a of the sheet substrate 420 are sequentially folded along each side of the element substrate 300 as shown in FIG. 13C to FIG. 13E.

Seventh Embodiment

Figure 14:
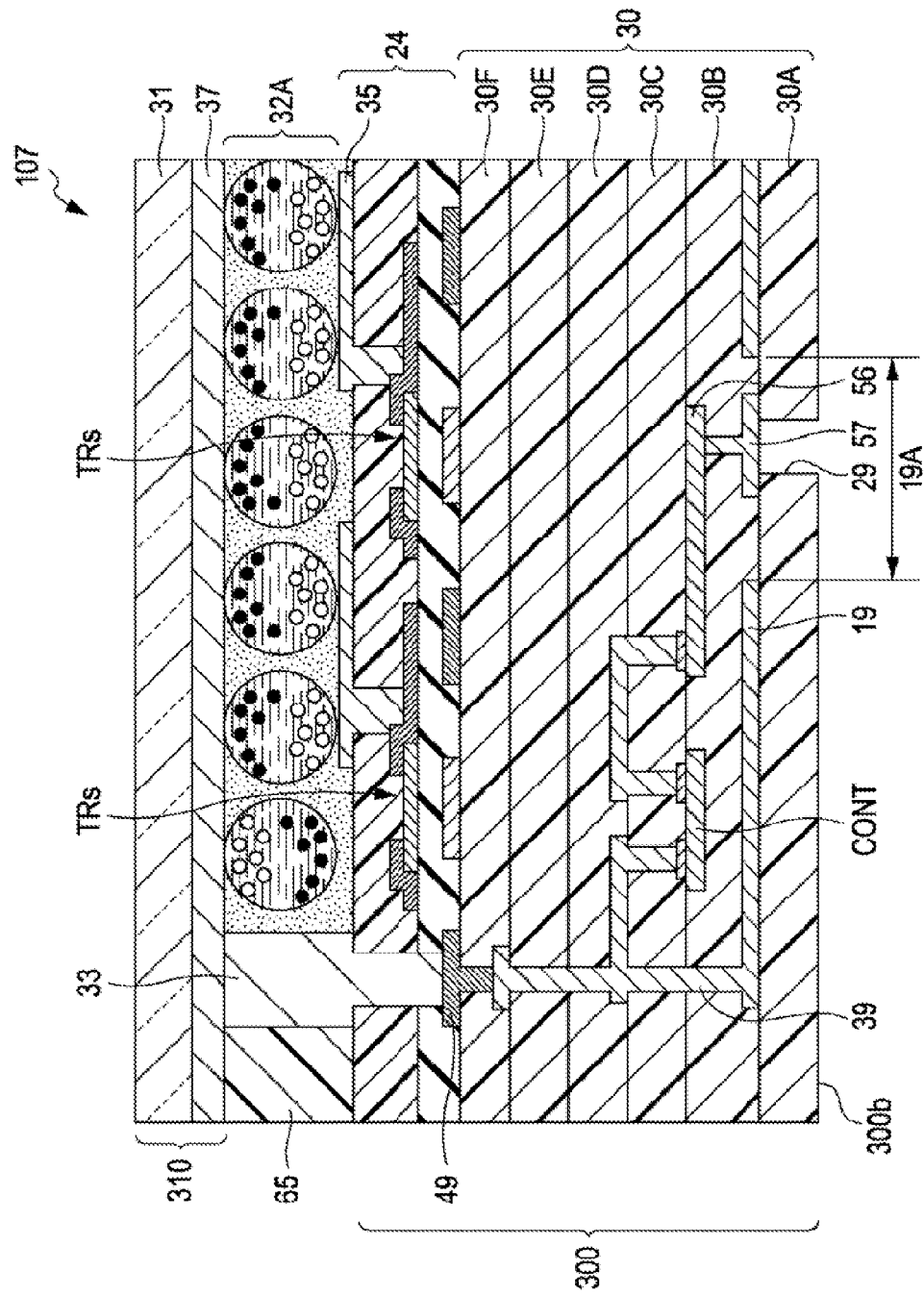
FIG. 14 is a cross-sectional diagram partially illustrating a configuration of an electrophoretic display device of a seventh embodiment.

FIG. 14 is a cross-sectional diagram partially illustrating a configuration of an electrophoretic display device of a seventh embodiment.

In an electrophoretic display device 107 of the embodiment, a battery 56 for supplying electric power to the controller CONT is embedded in an inner portion of the first substrate 30. An external connection terminal 57, which is in the same layer as the rear surface electrode 19 with no gaps, is connected to the battery 56. The external connection terminal 57 is disposed in a through hole 19A in the rear surface electrode 19 which is formed so as to partially overlap with the battery 56 in the planar view and is in a state of being exposed to the outside from a through hole 29 in the base material 30A which is positioned on the outermost side which configures the first substrate 30.

As the battery 56, a battery with a configuration where damage due to static electricity is difficult is adopted.

The electrophoretic display device 107 of the embodiment is provided with the battery 56 and a process for separately manufacturing the external connection terminal 57 is not necessary since the external connection terminal 57 for charging the battery 56 is formed in the same process of the rear surface electrode 19. Due to this, the manufacturing is easy but it is easy for static electricity to have an effect without the external connection terminal 57 being shielded by the rear surface electrode 19 due to the external connection terminal 57 being provided in a region where the rear surface electrode 19 does not exists. As a result, there is a configuration where it is difficult for static electricity to enter an inner portion since the external connection terminal 57 and the rear surface electrode 19 are prevented from being in direct connection with other members due to the rear surface electrode 19 and the external connection terminal 57 being formed between the base material 30A and the base material 30B and disposed more to the inner side than the rear surface 300b without being formed on the rear surface of the first substrate 30 (the rear surface 300b of the element substrate 300).

For example, static electricity is generated due to separation charge which is generated when an object and an object come into contact and there is separation. In addition, static electricity is also generated due to frictional charge which is generated when objects are in contact. As a result, it is possible to suppress the generation of static electricity which is caused by separation charge and frictional charge due to the rear surface electrode 19 and the external connection terminal 57 being provided in an inner portion of the first substrate 30.

Figure 15:
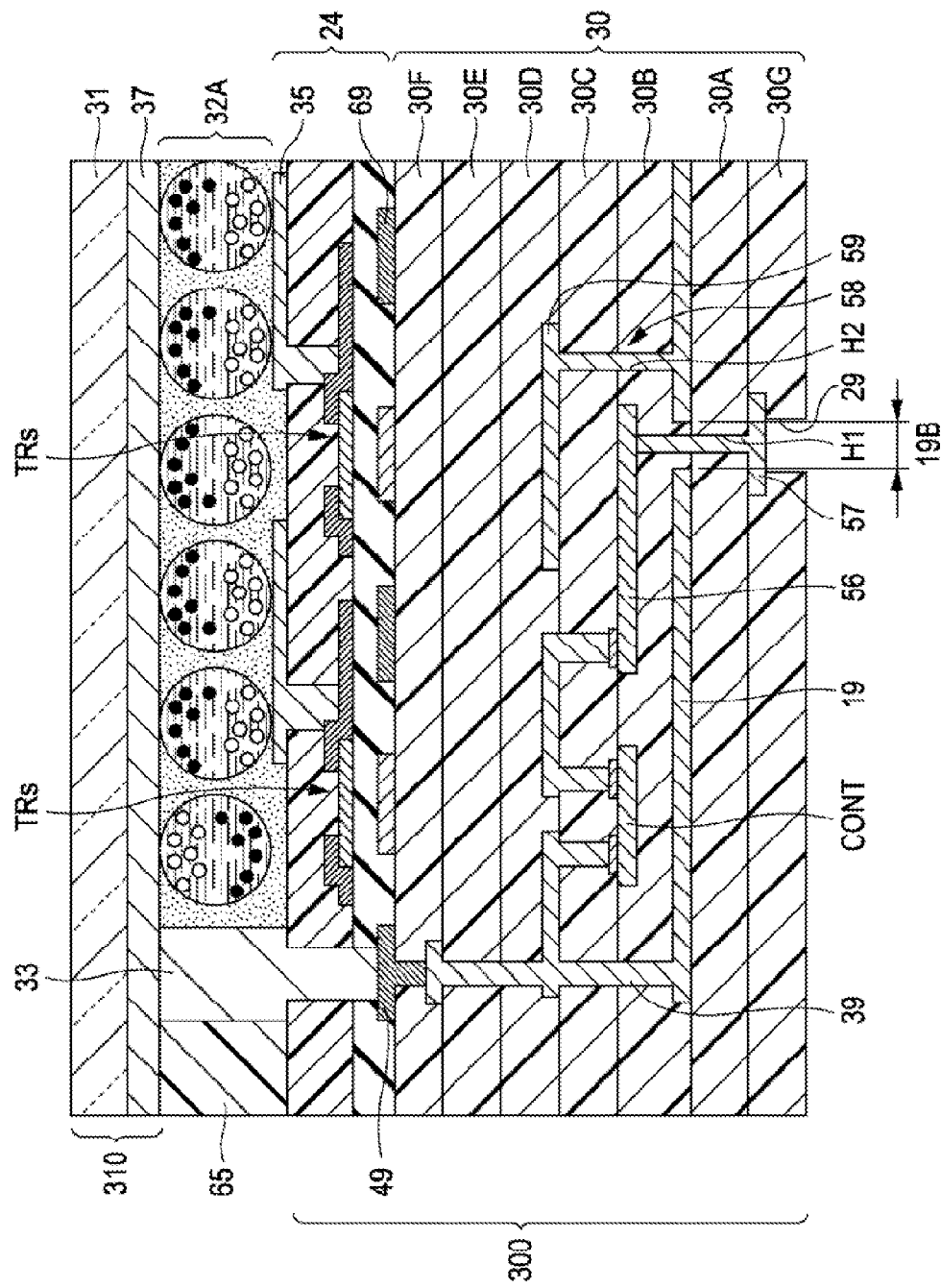
FIG. 15 is a diagram illustrating a modification of the electrophoretic display device of the seventh embodiment.

FIG. 15 is a diagram illustrating a modification of the electrophoretic display device of the seventh embodiment.

As shown in FIG. 15, the point that the element substrate 300 is configured by seven substrates and the external connection terminal 57 which is connected to the battery 56 and the rear surface electrode 19 are formed in different layers is different to the previous embodiment.

In the modification, one more base material 30G is provided on the rear surface side of the base material 30A and the external connection terminal 57 is formed between the base material 30G and the base material 30A. The external connection terminal 57 is in a state of being exposed to the outside from the through hole 29 in the base material 30G which is positioned on the outermost side which configures the first substrate 30.

Furthermore, a small through hole 19B is formed in the rear surface electrode 19 with a smaller opening area than the through hole 19A of the embodiment described above and the shield effect is large since it is possible to further prevent the entry of static electricity by reducing the opening region of the base material.

Furthermore, a shielding section 58, which surrounds the periphery of the battery 56 by being extended from the rear surface electrode 19, is provided in the embodiment. By the shielding section 58 being configured using a shield wiring 59 which is provided on a front surface of the base material 30C which is at an upper layer side of the battery 56 and exists above the battery 56 and the contact hole H2 which is formed by penetrating the base materials 30B and 30C which exist between the rear surface electrode 19, it is possible to reduce the effect due to static electricity, which has entered from the external connection terminal 57 side, with regard to the driving circuit layer 24 (the control transistor TRs).

In addition, it is possible to use the rear surface electrode 19 as the holding capacitance line 93 in the embodiment and modification above.

FIG. 16 is a cross-sectional diagram illustrating a schematic configuration of an electrophoretic display device of an eighth embodiment.

As shown in FIG. 16, electrostatic protection circuits 72 and 73 are provided in the embodiment between the external connection terminal 57 and the rear surface electrode 19 which are connected to the electronic component 10 such as the battery and the like.

Two common wirings of a high potential line (Vdd) 90 and a low potential line (Vss) 91 which are used by the element substrate 300 are provided and the electrostatic protection circuits 72 and 73 are provided with regard to the common wirings. Specifically, there is a configuration where the rear surface electrode 19 and the external connection terminal 57 which is to be protected are provided via the electrostatic protection circuits 72 and 73 between the high potential line Vdd and the low potential line Vss. It is preferable that the high potential line Vdd and the low potential line Vss be formed with a formation area with as wide a range as possible in the element substrate 300 (the first substrate 30), but this is not necessarily necessary and may be formed in a one wiring state.

The external connection terminal 57 and the rear surface electrode 19 which are connected to the electronic component 10 are connected via a plurality of electrostatic protection circuits 72A, 73A, 72B, and 73B in the embodiment. Specifically, the external connection terminal 57 and the rear surface electrode 19 are connected via the electrostatic protection circuits 72A and 73A which are connected to the high potential line (Vdd) 90 and are connected via the electrostatic protection circuits 72B and 73B which are connected to the low potential line (Vss) 91.

The electrostatic protection circuits 72 and 73 have a nonlinear form in both directions in terms of current and voltage characteristics, are in an open state when a high voltage is applied or when a low voltage is applied, and a surge voltage which causes static electricity and the like flows to the common wirings. That is, the electrostatic protection circuits 72 and 73 are configured so that an electric current flows between the external connection terminal 57 and the rear surface electrode 19 in a case where a predetermined difference in potential is generated between the external connection terminal 57 and the rear surface electrode 19.

For example, when the potential of the rear surface electrode 19 (the external connection terminal 57) becomes a potential which is equal to or more than Vdd and equal to or less than Vss, protection diodes D1 of each of the electrostatic protection circuits 72 (72A and 72B) and 73 (73A and 73B) conduct and it is possible for static electricity to be discharged by an electric current flowing from the external connection terminal 57 or the rear surface electrode 19 to the common wiring (the high potential line (Vdd) 90 or the low potential line (Vss) 91). In this manner, the electronic component 10 which is embedded in the first substrate 30 is protected from static electricity and electrostatic damage is prevented. Here, it is not necessarily necessary for the two common wirings to be Vdd and Vss.

Here, the electronic component 10 is provided as means for inputting data which is displayed from the outside by being provided for performing the exchange of signals from the outside. Alternatively, for the purpose other than that of the electro-optical device, for example, there may be a use as means for outputting detection data using a sensor or the like.

Figure 17A:
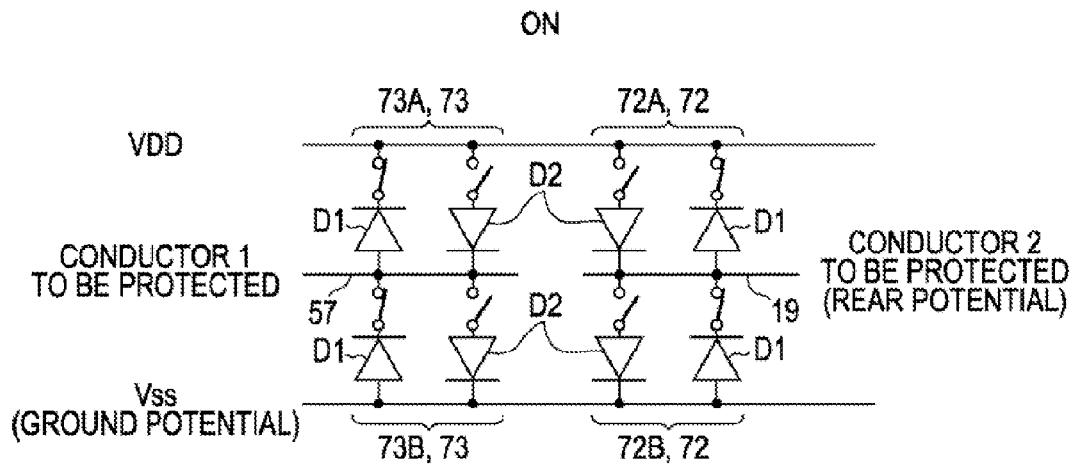
FIGS. 17A and 17B are equivalence circuit diagrams illustrating a specific configuration of an electrostatic protection circuit.

FIG. 17A is an equivalent circuit diagram of the electrostatic protection circuit when a power source of the electrophoretic display device is in an ON state.

As shown in FIG. 17A, when the power source of the electrophoretic display device is in the ON state, one of the protection diodes D1 out of the two protection diodes D1 and D2 which configure the electrostatic protection circuit 72A and 72B conducts and the other protection diode D2 does not conduct. Here, for example, due to unnecessary voltage being applied from the outside, when the rear surface electrode 19 is a potential which is equal to or more than the high potential line Vdd and is equal to or less than the low potential line Vss, the protection diode D1 of the electrostatic protection circuits 72A and 72B conducts and the potential which is applied to the external connection circuit 57 escapes to the common wiring (the high potential line (Vdd) 90 or the low potential line (Vss) 91) and electrostatic damage to the electronic component 10 is prevented.

Figure 17B:
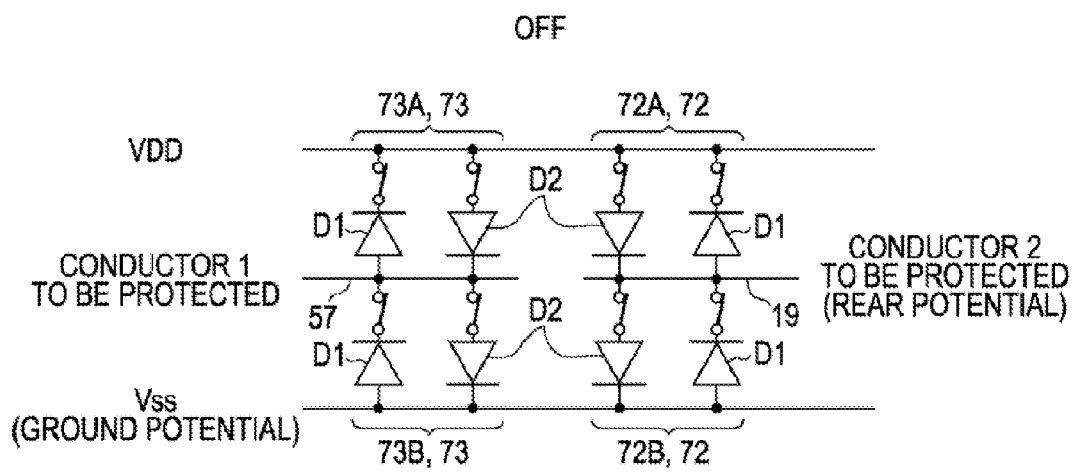

FIG. 17B is an equivalent circuit diagram of the electrostatic protection circuit when the power source of the electrophoretic display device is in an OFF state.

As shown in FIG. 17B, when the electrophoretic display device is in a non-operational state and the power source is in the OFF state, there is a configuration where the high potential line Vdd and the low potential line Vss are open and the protection diode D2 of each of the electrostatic protection circuits 72A, 72B, 73A, and 73B which are in a non-conduction state are connected to the common wiring (the high potential line (Vdd) 90 or the low potential line (Vss) 91). It is possible to perform the conducting of the protection diode D2 in the non-conduction state by, for example, turning off a transistor which is normally on. When in this state, the external connection terminal 57 which is to be protected and the rear surface electrode 19 are connected by a ring diode which is configured by the diodes D1 and D2. As a result, the difference in potential between the rear surface electrode 19 and the external connection terminal 57 does not become equal to or more than the total of threshold voltages Vth of the two diodes D1 and D2.

According to the embodiment, using the electrostatic protection circuit 72A, 72B, 73A, and 73B which are provided between the rear surface electrode 19 and the external connection terminal 57, an electric current flows from the rear surface electrode 19 or the external connection terminal 57 to the common wiring (the high potential line (Vdd) 90 or the low potential line (Vss) 91) and discharging is possible in a case of application of a voltage which is equal to or more than a predetermined voltage to the external connection terminal 57.

Due to the introduction of the configuration such as this, it is possible to disperse charge without damage to the electronic component even in a case where a charge is input to the external connection terminal 57 due to static electricity.

In the embodiment, there is a configuration where the electrostatic protection circuit is embedded in the first substrate 30 as an independent circuit separate to the electronic component which is to be protected, but may be directly built into the electronic component.

Figure 18A:
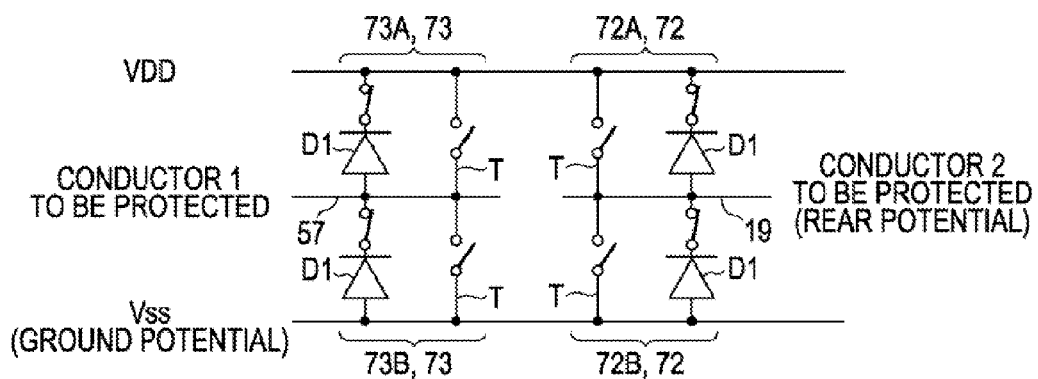
FIGS. 18A and 18B are equivalence circuit diagrams illustrating another configuration of an electrostatic protection circuit.
Figure 18B:
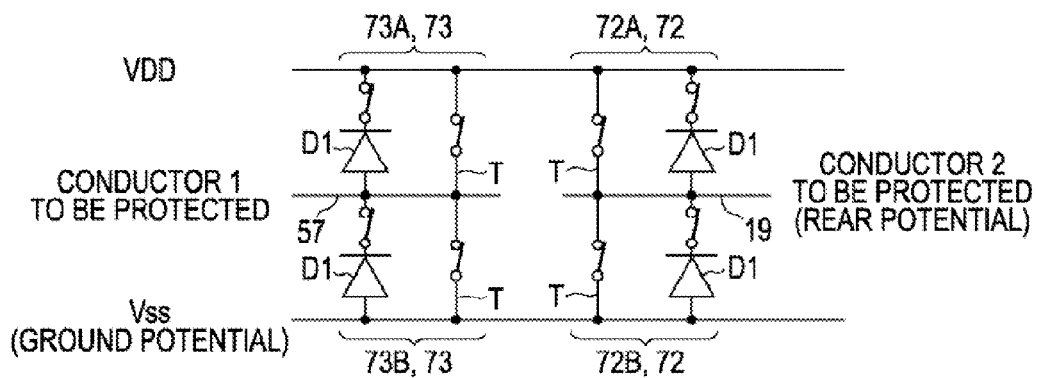
Figure 19:
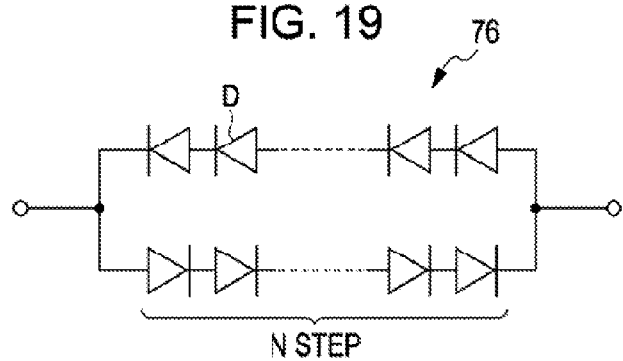
FIG. 19 is an equivalence circuit diagram illustrating still another configuration of an electrostatic protection circuit.

FIGS. 18A to 19 are diagrams illustrating another configuration of the electrostatic protection circuit.

As shown in FIGS. 18A and 18B, there may be an electrostatic protection circuit which is configured so that a switching element T is provided instead of the protection diode D2 described above and the rear surface electrode 19 and the external connection terminal 57 short when the power source of the electrophoretic display device is in an OFF state.

Figure 20:
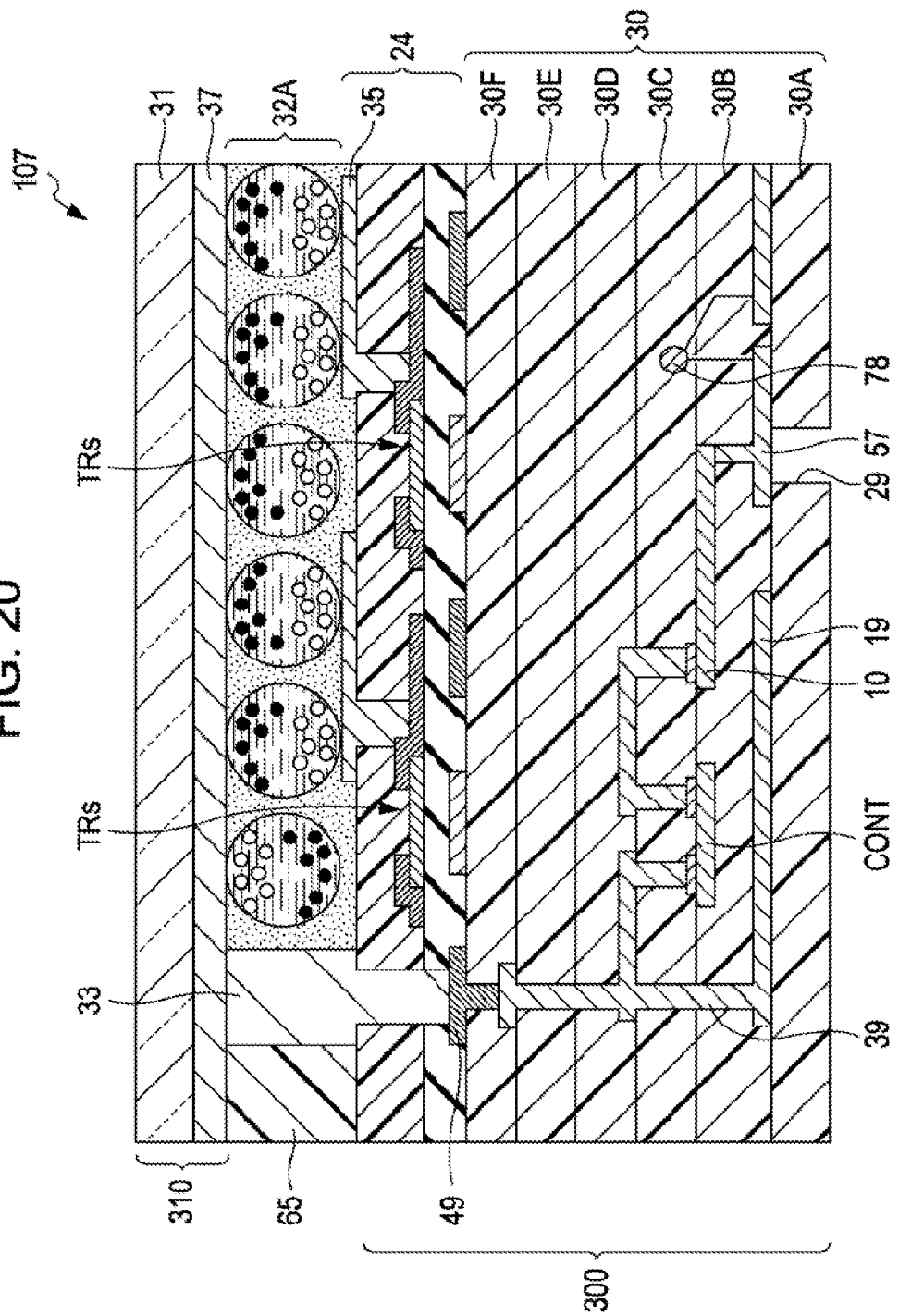
FIG. 20 is a cross-sectional diagram illustrating another configuration of the electrophoretic display device of the eighth embodiment.

As shown in FIG. 19, the rear surface electrode 19 and the external connection terminal 57 may be connected via an electrostatic protection circuit which is formed from a multi-step ring diode 76. Here, the difference in voltage between the rear surface electrode 19 and the external connection terminal 57 is reduced by the protection diode D conducting when a difference in voltage which is equal to or larger than a voltage, which is obtained by multiplying the threshold voltage Vth of one protection diode D and the number of steps n, is applied to both terminals of the protection diode D. In this case, as shown in FIG. 20, there is a configuration where the rear surface electrode 19 and the external connection terminal 57 are connected via the electrostatic protection circuit 78.

In the embodiment shown previously, it is preferable that there be no difference in potential between the rear surface electrode 19 and the opposing electrode 37, but there may be a configuration where the difference is constant even if there is a slight difference in potential.

Other Application of Electrical Device

Figure 21A:
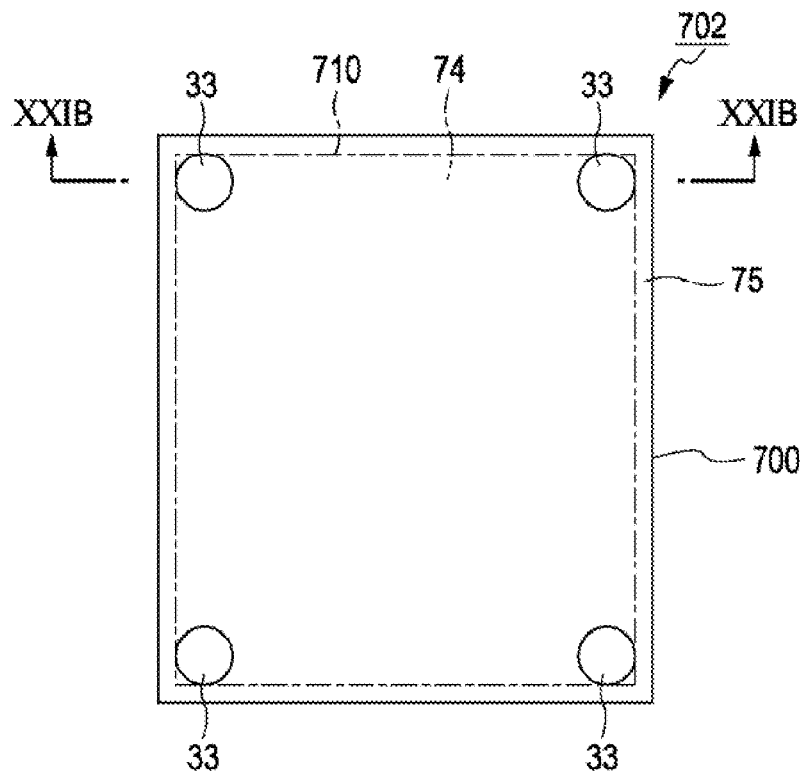
FIGS. 21A and 21B are diagrams illustrating a schematic configuration of a piezoelectric sensor where the configuration of the electrical device of the third embodiment has been applied.
Figure 21B:
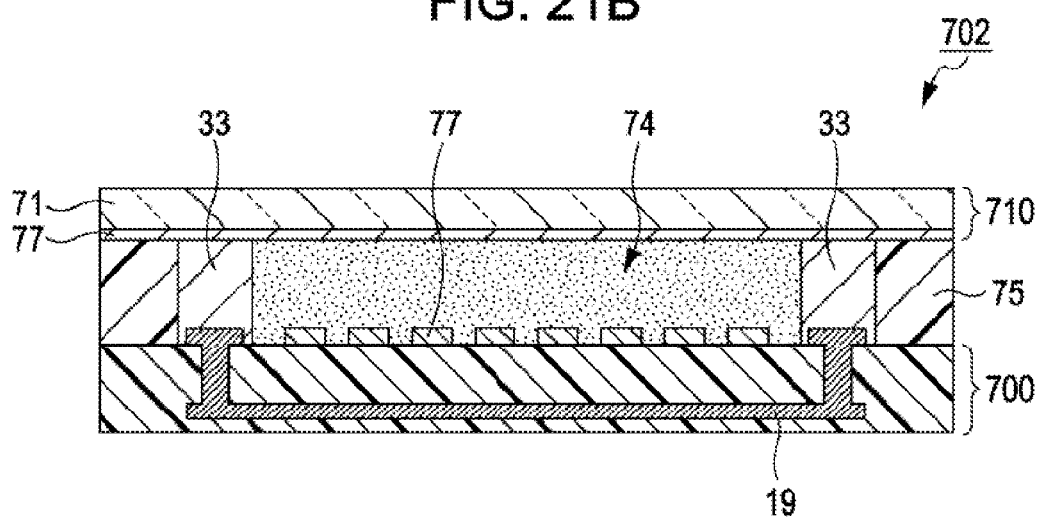

FIGS. 21A and 21B are diagrams illustrating a schematic configuration of a detection element used in a piezoelectric sensor where the configuration of the electrical device of the third embodiment has been applied, FIG. 21A is a planar diagram, and FIG. 21B is a cross-sectional diagram along a line XXIB-XXIB of FIG. 21A.

The piezoelectric sensor is configured to be provided with one or a plurality of detection elements 702 where a piezoelectric layer (functional element) 74 is provided between an element substrate 700 and an opposing substrate 710. As the element substrate 700 and the opposing substrate 710 of the detection element 702, it is possible to adopt each of the configurations of the element substrate and the opposing substrate in the same manner as the electrophoretic display device of the third embodiment described above.

Specifically, the opposing substrate 710 of the embodiment is configured to have a protection substrate 71 which is formed from PET with a thickness of 0.2 lam and a conducting film 77 which is formed from carbon nanotubes which are provided on a surface on the piezoelectric layer 74 side of the protection substrate 71 and is able to bend in the same manner as the element substrate 700. In addition, the piezoelectric layer 74 is formed from a copolymer of trifluoroethylene and vinylidene fluoride with a thickness of 1 μm.

Then, when pressure is applied from the outside with regard to the piezoelectric sensor, in each of the detection elements 702, whether or not an object has come into contact with regard to the piezoelectric sensor is determined due to detection of a change in voltage which is induced between a plurality of detection electrodes (not shown), which are provided on the element substrate 700 instead of the plurality of pixel electrodes described above, and the conducting film 77 of the opposing substrate 710.

Here, as the element substrate 700, it is possible to adopt the configuration of either of the element substrates out of the embodiments described above in the same manner.

In addition, the piezoelectric layer 74, the conducting film 77, and the protection substrate 71 may use other organic or inorganic materials without being limited to the material described above. There is a configuration where materials are used in the same manner as each of the embodiments described above in a sealing material 75 which is disposed on periphery edge portions of the element substrate 700 and the opposing substrate 710 and surrounds the periphery of the piezoelectric layer 74. In addition, there may be a configuration where an electric current which is supplied to the detection electrode and the conducting film 77 is detected.

The piezoelectric sensor has a film form which has abundant flexibility like paper and detects pressure distribution and the like when, for example, a person sits down on a chair. In addition, when the plurality of base materials which configure the element substrate 700 is configured by a material which has flexibility or expansion and contraction properties, it is possible to track complex deformations and detect an accurate value.

In addition, the output of the detection value is performed by an output electrode which is formed on the front and rear surfaces of the detection element 702 while performed using a communication functional element (an antenna and an IC which performs communication) which is embedded in the element substrate 700. The charging of the battery which is embedded in an inner portion of the element substrate 700 and the input and output of other signals is the same.

In addition, if a pyroelectric material is used instead of a piezoelectric material, a configuration of a two-dimensional temperature sensor is possible, and if a photoelectric conversion material is used, it is possible to configure a two-dimensional light sensor, a terahertz sensor, or an X-ray sensor. Furthermore, it is possible to be applied to other electrical apparatuses.

In addition, it is possible to improve the moisture resistance capacity or the like in the embodiments and the modifications described above by wrapping the entire device with a transparent insulating sheet or the like.

In addition, it is not necessary for the up and down conduction section 33 to be at an inner side of the sealing material 65 and the up and down conduction section 33 may be disposed at an outer side.

For example, the preferred embodiments of the invention have been described while referencing the attached diagrams, but it is needless to say that the invention is not limited to these examples. It is to be clear to those skilled in the art that various modifications and alterations are possible within the range of the technical concept which is described in the scope of the claims and it is to be understood that these modifications and alterations belong to the technical scope of the invention.

For example, as the shape of the rear surface electrode 19, a shape with no gaps may be formed along the planar surface shape of the element substrate 300 as in the embodiments described previously, but the shape is not limited to this and may be configured as a mesh shape or a strip shape.

Electronic Apparatus

Next, a case where the electrophoretic display device of each of the embodiments described above is applied to electronic apparatuses will be described.

Figure 22A:
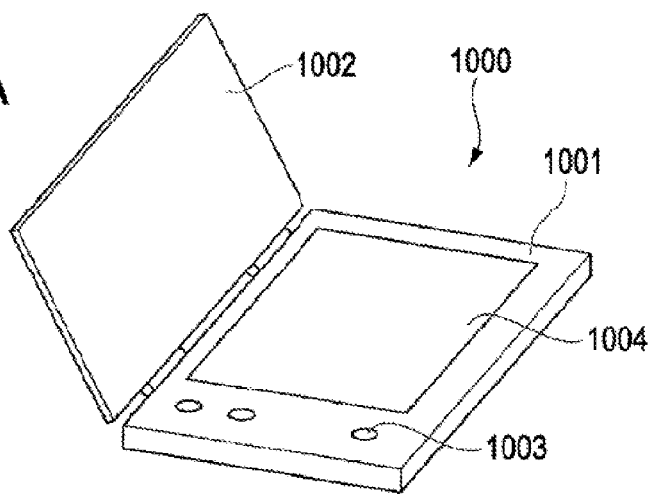
FIGS. 22A to 22C are perspective diagrams illustrating configurations of electronic apparatuses.
Figure 22B:
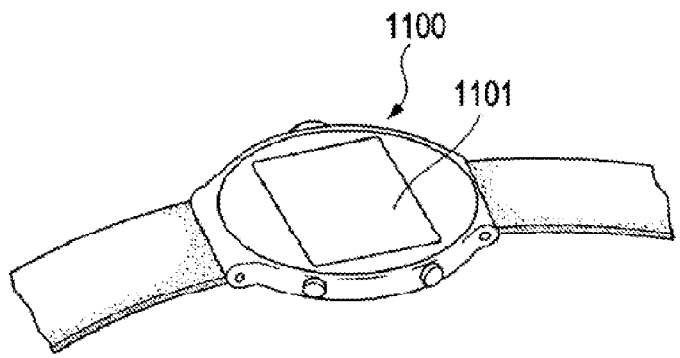
Figure 22C:
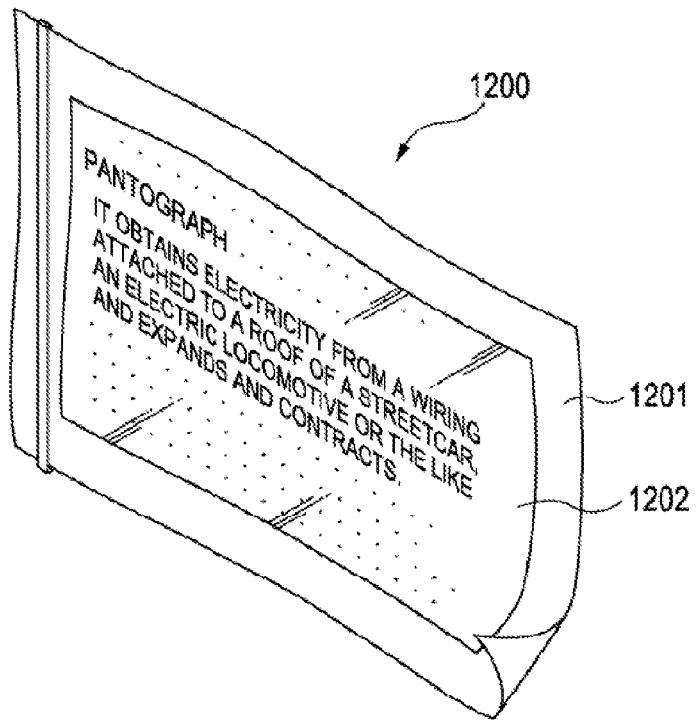

FIGS. 22A to 22C are perspective diagrams illustrating specific configurations of electronic apparatuses where the electrophoretic display device of the embodiment has been applied.

FIG. 22A is a perspective diagram illustrating an electronic book which is one example of the electronic apparatus. An electronic book (the electronic apparatus) 1000 is provided with a frame 1001 with a book shape, a cover 1002 (able to be opened and closed) provided to freely rotate with regard to the frame 1001, an operation section 1003, and a display section 1004 which is configured using the electrophoretic display device of the invention.

FIG. 22B is a perspective diagram illustrating a wrist watch which is one example of the electronic apparatus. A wrist watch (the electronic apparatus) 1100 is provided with a display section 1101 which is configured using the electrophoretic display device of the invention.

FIG. 22C is a perspective diagram illustrating an electronic paper which is an example of the electronic apparatus. An electronic paper (the electronic apparatus) 1200 is provided with a body section 1201 which is configured using a rewriteable sheet having the same feeling and flexibility as paper and a display section 1202 which is configured using the electrophoretic display device of the invention.

For example, since it is supposed that a purpose of the electronic book and the electronic paper and the like is to have characters repeatedly written onto a white background, it is necessary to remove residual images when erasing and residual images over time.

Here, the range of electronic apparatuses to which the electrophoretic display device of the invention can be applied is not limited to these and broadly includes apparatuses which use a visual change in color tone which accompanies the movement of charged particles.

According to the electronic book 1000, the wrist watch 1100 and the electronic paper 1200 above, since the electrophoretic display device according to the invention is adopted, there is a high quality electronic apparatus with superior reliability which performs display which is close to bright full color with excellent visual recognition.

Here, the electronic apparatuses described above exemplify the electronic apparatus according to the invention and do not limit the technical scope of the invention. For example, it is possible to appropriately use the electrophoretic display device according to the invention also in display sections of electronic apparatuses such as a mobile phone or a portable audio device and as electronic paper such as work sheets such as a manual, educational documents, exercise books, and information sheets.

The entire disclosure of Japanese Patent Application No. 2011-045479, filed Mar. 2, 2011 is expressly incorporated by reference herein.

What is claimed is:

1. An electrical device comprising:
a first substrate having a first side and a second side, the first side being opposed to the second side;
a second substrate opposed to the first side of the first substrate;
a functional element arranged between the first side of the first substrate and the second substrate;
a first electrode arranged to a first substrate side of the functional element, the first electrode overlapping with the functional element in a planar view;
a second electrode arranged to a second substrate side of the functional element, the second electrode overlapping with the functional element in the planar view;
an electronic circuit arranged between the functional element and the first electrode, the electronic circuit overlapping with the first electrode and the second electrode in the planar view, the electronic circuit driving the functional element; and
a connecting section electrically connecting the first electrode to the second electrode;
a protection circuit coupled between an output terminal of the electronic circuit and the first electrode;
a first wiring arranged between the first electrode and the functional element, a first potential being applied to the first wiring; and
a second wiring arranged between the first electrode and the functional element, a second potential, which is different from the first potential, being applied to the second wiring,
wherein the protection circuit comprises a first electrostatic protection circuit coupled between the output terminal and the first wiring, and a second electrostatic protection circuit coupled between the output terminal and the second wiring.

2. The electrical device according to claim 1, wherein the first electrode and at least a part of the connecting section are embedded in the first substrate.

3. The electrical device according to claim 1, wherein:
the first electrode is arranged to the second side of the first substrate, and
at least a part of the connecting section is embedded in the first substrate.

4. The electrical device according to claim 1, further comprising:
a third substrate opposed to the second side of the first substrate;

the first electrode arranged to a third side of the third substrate, the third substrate opposed to the second substrate; and at least a part of the connecting section embedded in the first substrate.

5. The electrical device according to claim 1, further comprising:

a sealing material disposed between the first electrode and the first substrate; and a conduction section provided in the sealing material, the first electrode electrically connected to the third electrode via the conduction section.

6. The electrical device according to claim 1, further comprising:

a terminal connected to the electronic circuit, at least a part of the terminal not being overlapped with the first electrode in the planar view.

7. The electrical device according to claim 1, wherein the electronic circuit is embedded in the first substrate and the electronic circuit is a controller which is coupled to the connecting section.

8. The electrical device according to claim 1, the connecting section further comprising:

a first contact hole connecting the first electrode to the first wiring; and a second contact hole connecting the first wiring to the second wiring.

9. The electrical device according to claim 8, wherein the first contact hole has a portion that is not overlapped with the second contact hole in the planar view.

10. The electrical device according to claim 8, wherein the connecting section is provided at least along one side of the first substrate.

11. The electrical device according to claim 1, the connecting section further comprising:

a first wiring that is arranged between the first electrode and the functional element;

a second wiring that is arranged between the first wiring and the functional element;

a third wiring that is arranged between the second wiring and the functional element;

a first contact hole that connects the first wiring to the second wiring; and a second contact hole that connects the second wiring to the third wiring.

12. The electrical device according to claim 11, wherein the first contact hole has a portion that is not overlapped with the second contact hole in the planar view.

13. The electrical device according to claim 11, wherein the connecting section is provided at least along one side of the first substrate.

14. The electrical device according to claim 1, wherein the first substrate comprises base materials which have a flexibility.

15. The electrical device according to claim 1, wherein:

the first substrate comprises a first base material and a second base material, the second base material arranged between the first base material and the functional element, the electrical circuit is arranged between the first base material and a second base material, and the second base material has a light blocking property.

16. The electrical device according to claim 1, further comprising:

a third electrode arranged between the functional element and the second side of the first substrate, wherein the functional element is an electro-optical element, and an option state of the electro-optical element depends on a voltage between the second electrode and the third electrode.

* * * * *